(12) United States Patent
Kim et al.

(10) Patent No.: US 12,408,379 B2
(45) Date of Patent: Sep. 2, 2025

(54) SEMICONDUCTOR DEVICE AND METHOD OF FABRICATING THE SAME

(71) Applicant: Samsung Electronics Co., Ltd., Suwon-si (KR)

(72) Inventors: Seungkyu Kim, Seoul (KR); Yonghee Park, Hwaseong-si (KR); Dong-Gwan Shin, Hwaseong-si (KR); Dae Sin Kim, Suwon-si (KR); Sangyong Kim, Suwon-si (KR); Joohyung You, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 532 days.

(21) Appl. No.: 17/890,547

(22) Filed: Aug. 18, 2022

(65) Prior Publication Data
US 2023/0231026 A1    Jul. 20, 2023

(30) Foreign Application Priority Data

Jan. 19, 2022 (KR) .......................... 10-2022-0007849

(51) Int. Cl.
*H01L 29/423* (2006.01)
*H01L 29/08* (2006.01)
(Continued)

(52) U.S. Cl.
CPC ..... *H10D 30/6735* (2025.01); *H10D 30/6757* (2025.01); *H10D 62/151* (2025.01); *H10D 64/021* (2025.01)

(58) Field of Classification Search
CPC .......... H10D 30/6735; H10D 30/6757; H10D 62/151; H10D 64/021; H10D 30/797;
(Continued)

(56) References Cited

U.S. PATENT DOCUMENTS 6,642,115 B1    11/2003    Cohen et al.
7,253,060 B2    8/2007    Yun et al.
(Continued)

FOREIGN PATENT DOCUMENTS

JP    2011-003797 A    1/2011
KR    10-0618831 B1    9/2006

*Primary Examiner* — Tong-Ho Kim
(74) *Attorney, Agent, or Firm* — Harness, Dickey & Pierce, P.L.C.

(57) ABSTRACT

A semiconductor device includes a substrate including an active pattern, a channel pattern on the active pattern and including semiconductor patterns vertically stacked and spaced apart from each other, a source/drain pattern connected to the semiconductor patterns, a gate electrode on the semiconductor patterns and extending in a first direction, and a gate insulating layer between the semiconductor patterns and the gate electrode. A first semiconductor pattern of the semiconductor patterns includes opposite side surfaces in the first direction, and bottom and top surfaces. The gate insulating layer covers the opposite side surfaces, and the bottom and top surfaces and includes a first region on one of the opposite side surfaces of the first semiconductor pattern and a second region on one of the top or bottom surfaces of the first semiconductor pattern, and a thickness of the first region may be greater than a thickness of the second region.

20 Claims, 35 Drawing Sheets

(51) Int. Cl.
*H01L 29/66* (2006.01)
*H01L 29/786* (2006.01)
*H10D 30/67* (2025.01)
*H10D 62/13* (2025.01)
*H10D 64/01* (2025.01)

(58) Field of Classification Search
CPC .. H10D 30/43; H10D 64/017; H10D 30/0212; H10D 30/014; H10D 64/018; H10D 62/822; H10D 62/121; H10D 62/405; H10D 64/256; H10D 84/0179; H10D 84/0144; H10D 84/0149; H10D 84/038; H10D 84/83; H10D 30/701; H10D 84/017; H10D 84/0181; H10D 84/85; H10D 64/516; H10D 84/834; B82Y 10/00
USPC ........................................................ 257/288
See application file for complete search history.

(56) References Cited

U.S. PATENT DOCUMENTS

| | | |
|---|---|---|
| 8,022,439 B2 | 9/2011 | Kajiyama |
| 9,647,098 B2 | 5/2017 | Obradovic et al. |
| 10,014,390 B1 | 7/2018 | Bouche et al. |
| 10,916,655 B2 | 2/2021 | Song et al. |
| 11,018,222 B1 | 5/2021 | O'Brien et al. |
| 2010/0320504 A1* | 12/2010 | Kajiyama .......... H10D 30/0323 257/E29.264 |
| 2020/0058653 A1* | 2/2020 | Chiang ................ H10D 62/80 |
| 2020/0105759 A1 | 4/2020 | Bowonder et al. |
| 2020/0105929 A1 | 4/2020 | Zhang et al. |
| 2021/0134785 A1 | 5/2021 | Yang et al. |
| 2021/0217848 A1* | 7/2021 | Kim .................... H10D 30/014 |
| 2021/0305401 A1 | 9/2021 | Liaw |
| 2021/0320191 A1 | 10/2021 | Cheng et al. |
| 2021/0343841 A1 | 11/2021 | Shin et al. |

* cited by examiner

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2022-0007849, filed on Jan. 19, 2022, in the Korean Intellectual Property Office, the entire contents of which are hereby incorporated by reference.

BACKGROUND

The present inventive concepts relate to semiconductor devices and methods of fabricating the same, and in particular, to semiconductor devices including a field effect transistor and methods of fabricating the same.

A semiconductor device includes an integrated circuit composed of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize the semiconductor devices with high performance.

SUMMARY

Some example embodiments of the inventive concepts provide a semiconductor device with improved electrical characteristics.

Some example embodiments of the inventive concepts provide a method of fabricating a semiconductor device with improved electrical characteristics.

According to some example embodiments of the inventive concepts, a semiconductor device may include a substrate including an active pattern, a channel pattern on the active pattern, the channel pattern including a plurality of semiconductor patterns vertically stacked to be spaced apart from each other, a source/drain pattern connected to the plurality of semiconductor patterns, a gate electrode on the plurality of semiconductor patterns, the gate electrode extending in a first direction that is parallel to a top surface of the substrate, and a gate insulating layer between the plurality of semiconductor patterns and the gate electrode. The plurality of semiconductor patterns may include a first semiconductor pattern including opposite side surfaces, which are opposite to each other in the first direction, a bottom surface, and a top surface, and the gate insulating layer may cover the opposite side surfaces of the first semiconductor pattern, the bottom surface of the first semiconductor pattern, and the top surface of the first semiconductor pattern. The gate insulating layer may include a first region on one of the opposite side surfaces of the first semiconductor pattern and a second region on one of the top surface of the first semiconductor pattern or the bottom surface of the first semiconductor pattern, and a thickness of the first region in the first direction may be greater than a thickness of the second region in a second direction that is perpendicular to the top surface of the substrate.

According to some example embodiments of the inventive concepts, a semiconductor device may include a substrate including an active pattern, a channel pattern on the active pattern, the channel pattern including a plurality of semiconductor patterns vertically stacked to be spaced apart from each other, a source/drain pattern connected to the plurality of semiconductor patterns, a gate electrode on the plurality of semiconductor patterns, and a gate insulating layer between the plurality of semiconductor patterns and the gate electrode. The gate electrode may include a portion between a first semiconductor pattern and a second semiconductor pattern, which are two adjacent semiconductor patterns of the plurality of semiconductor patterns, and the gate insulating layer may include a first region between the portion of the gate electrode and a side surface of the source/drain pattern and a second region between the portion of the gate electrode and a bottom surface of the second semiconductor pattern. The first region of the gate insulating layer may directly cover the side surface of the source/drain pattern, and a thickness of the first region in a first direction that is parallel to a top surface of the substrate may be greater than a thickness of the second region in a second direction that is perpendicular to the top surface of the substrate.

According to some example embodiments of the inventive concepts, a semiconductor device may include a substrate including an active region, a device isolation layer defining an active pattern on the active region, a channel pattern and a source/drain pattern on the active pattern, a gate electrode on the channel pattern, the gate electrode extending in a first direction that is parallel to a top surface of the substrate, a gate insulating layer interposed between the gate electrode and the channel pattern, a gate spacer on a side surface of the gate electrode, a gate capping pattern on a top surface of the gate electrode, an interlayer insulating layer on the gate capping pattern, an active contact that penetrates the interlayer insulating layer and electrically connected to the source/drain pattern, a metal-semiconductor compound layer between the active contact and the source/drain pattern, a gate contact that penetrates the interlayer insulating layer and the gate capping pattern and is electrically connected to the gate electrode, a first metal layer on the interlayer insulating layer, the first metal layer including first interconnection lines, which are electrically connected to the active contact and the gate contact, respectively, and a power line, and a second metal layer on the first metal layer. The second metal layer may include second interconnection lines electrically connected to the first metal layer, and the channel pattern may include a plurality of semiconductor patterns, which are stacked in a second direction perpendicular to the top surface of the substrate. The gate insulating layer may be provided to enclose a first semiconductor pattern, which is one of the semiconductor patterns, and the gate insulating layer enclosing the first semiconductor pattern may have a first thickness in the first direction and a second thickness in the second direction. The first thickness may be greater than the second thickness.

According to some example embodiments of the inventive concepts, a method of fabricating a semiconductor device may include forming a stacking pattern on a substrate, the stacking pattern including active layers and sacrificial layers, which are alternately stacked, forming a sacrificial pattern, which is extended in a first direction extending in parallel to a top surface of the substrate, on the stacking pattern, etching the stacking pattern, which is adjacent to a side of the sacrificial pattern, to form a recess, forming a source/drain pattern in the recess, the active layers connected to the source/drain pattern forming semiconductor patterns constituting a channel pattern, removing the sacrificial pattern and the sacrificial layers to expose the semiconductor patterns, and sequentially forming a gate insulating layer and a gate electrode on the exposed semiconductor patterns. A first semiconductor pattern, which is one of the semiconductor patterns, may include opposite side surfaces, which are opposite to each other in the first direction, a bottom surface, and a top surface. The forming of the gate insulating layer may include forming an interface layer on the opposite side surfaces, the bottom surface, and the top surface of the first semiconductor pattern. Here, a formation rate of the interface layer on the opposite side surfaces of the first semiconductor pattern may be higher than a formation rate of the interface layer on the bottom and top surfaces of the first semiconductor pattern.

DETAILED DESCRIPTION

Figure 1:
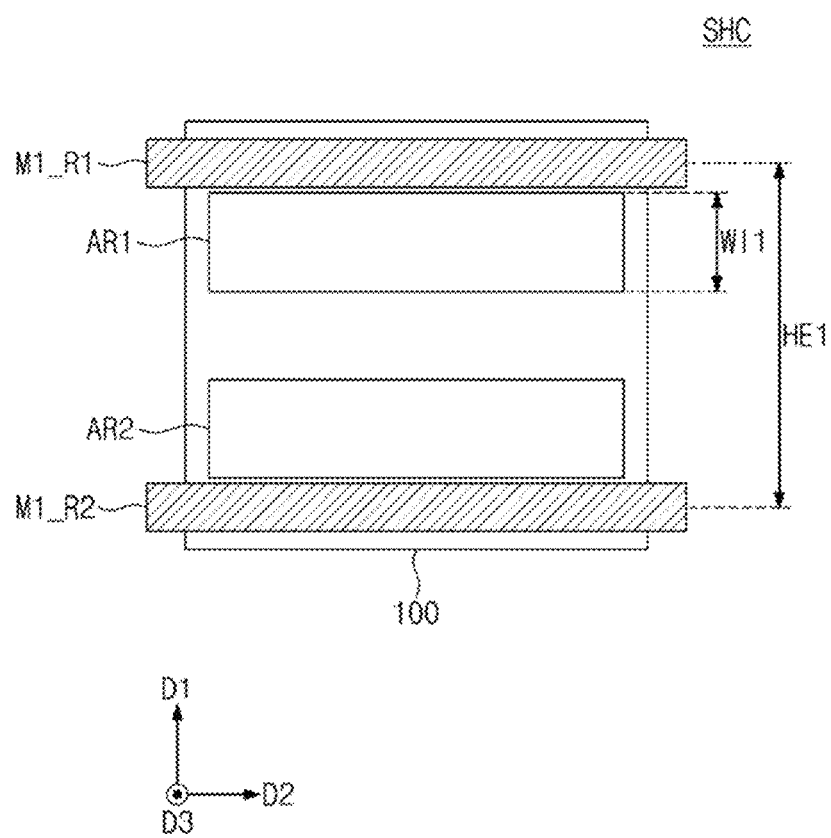
FIGS. 1, 2, and 3 are conceptual diagrams illustrating logic cells of a semiconductor device according to some example embodiments of the inventive concepts.

Example embodiments of the inventive concepts will now be described more fully with reference to the accompanying drawings, in which some example embodiments are shown.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) may be understood to be isolated from direct contact with each other, in general and/or in the particular direction (e.g., isolated from direct contact with each other in a vertical direction, isolated from direct contact with each other in a lateral or horizontal direction, etc.).

Figure 2:
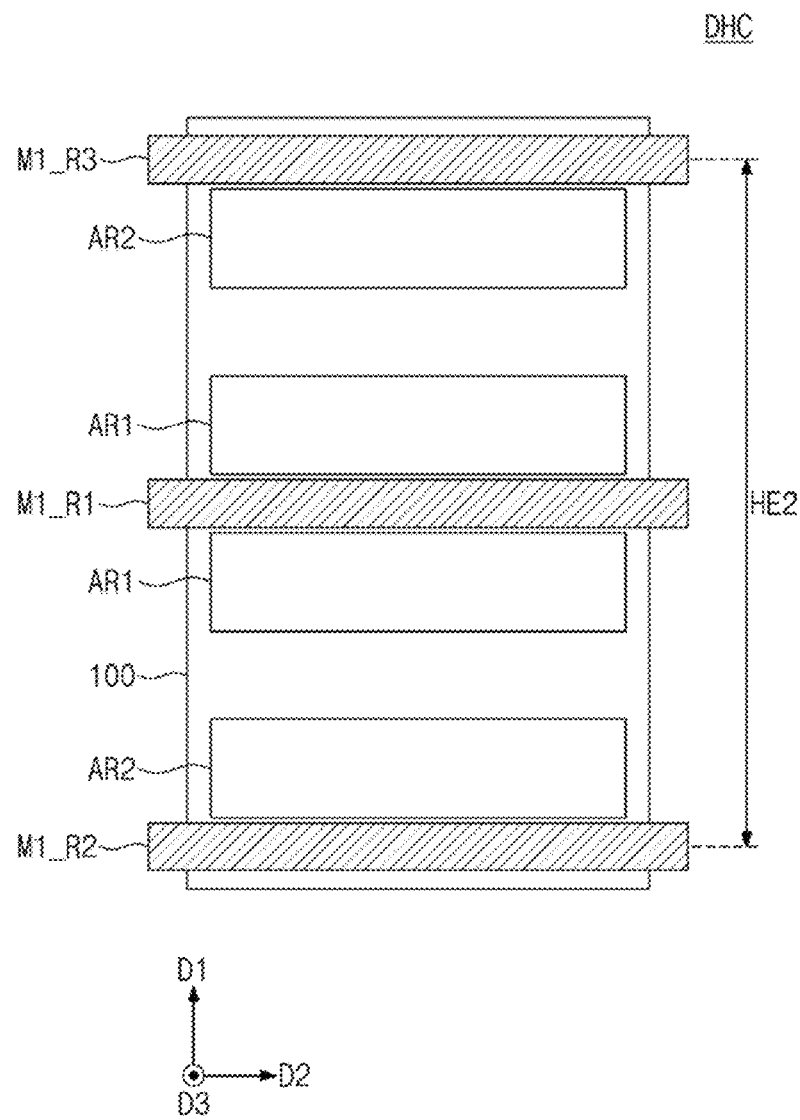
Figure 3:
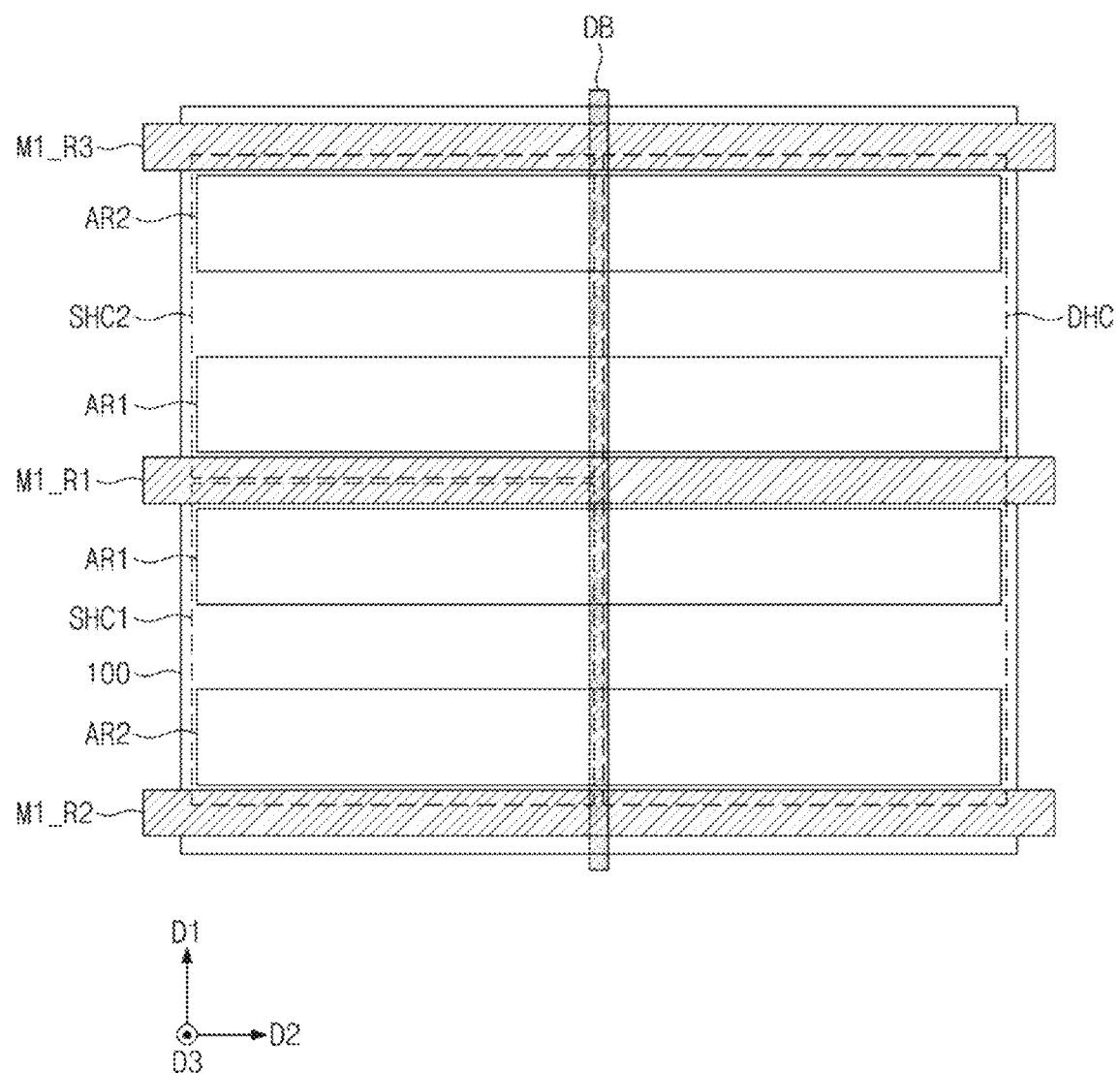

FIGS. 1, 2, and 3 are conceptual diagrams illustrating logic cells of a semiconductor device according to some example embodiments of the inventive concepts.

Referring to FIG. 1, a single height cell SHC may be provided. In detail, a first power line M1_R1 and a second power line M1_R2 may be provided on a substrate 100. The first power line M1_R1 may be a conduction path, to which a source voltage VSS (e.g., a ground voltage) is provided. The second power line M1_R2 may be a conduction path, to which a drain voltage (VDD) (e.g., a power voltage) is provided.

The single height cell SHC may be defined between the first power line M1_R1 and the second power line M1_R2. The single height cell SHC may include one first active region AR1 and one second active region AR2. One of the first and second active regions AR1 and AR2 may be a PMOSFET region, and the other may be an NMOSFET region. In other words, the single height cell SHC may have a CMOS structure provided between the first and second power lines M1_R1 and M1_R2.

Each of the first and second active regions AR1 and AR2 may have a first width WI1 in a first direction D1. A length of the single height cell SHC in the first direction D1 may be defined as a first height HE1. The first height HE1 may be substantially equal to a distance (e.g., a pitch) between the first and second power lines M1_R1 and M1_R2.

The single height cell SHC may constitute a single logic cell. In the present specification, the logic cell may mean a logic device (e.g., AND, OR, XOR, XNOR, inverter, and so forth), which is configured to execute a specific function. In other words, the logic cell may include transistors constituting the logic device and interconnection lines connecting transistors to each other.

Referring to FIG. 2, a double height cell DHC may be provided. In detail, a first power line M1_R1, a second power line M1_R2, and a third power line M1_R3 may be provided on the substrate 100. The first power line M1_R1 may be disposed between the second power line M1_R2 and the third power line M1_R3. The third power line M1_R3 may be a conduction path, to which the source voltage (VSS) is provided.

The double height cell DHC may be defined between the second power line M1_R2 and the third power line M1_R3. The double height cell DHC may include a pair of first active regions AR1 and a pair of second active regions AR2.

One of the second active regions AR2 may be adjacent to the second power line M1_R2. The other of the second active regions AR2 may be adjacent to the third power line M1_R3. The pair of the first active regions AR1 may be adjacent to the first power line M1_R1. When viewed in a plan view, the first power line M1_R1 may be disposed between the pair of the first active regions AR1.

A length of the double height cell DHC in the first direction D1 may be defined as a second height HE2. The second height HE2 may be about two times the first height HE1 of FIG. 1. The pair of the first active regions AR1 of the double height cell DHC may be combined to serve as a single active region.

In some example embodiments, the double height cell DHC shown in FIG. 2 may be defined as a multi-height cell. Although not shown, the multi-height cell may include a triple height cell whose cell height is about three times that of the single height cell SHC.

Referring to FIG. 3, a first single height cell SHC1, a second single height cell SHC2, and a double height cell DHC may be two-dimensionally arranged on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A division structure DB may be provided between the first single height cell SHC1 and the double height cell DHC and between the second single height cell SHC2 and the double height cell DHC. The active region of the double height cell DHC may be electrically separated from the active region of each of the first and second single height cells SHC1 and SHC2 by the division structure DB.

Figure 4:
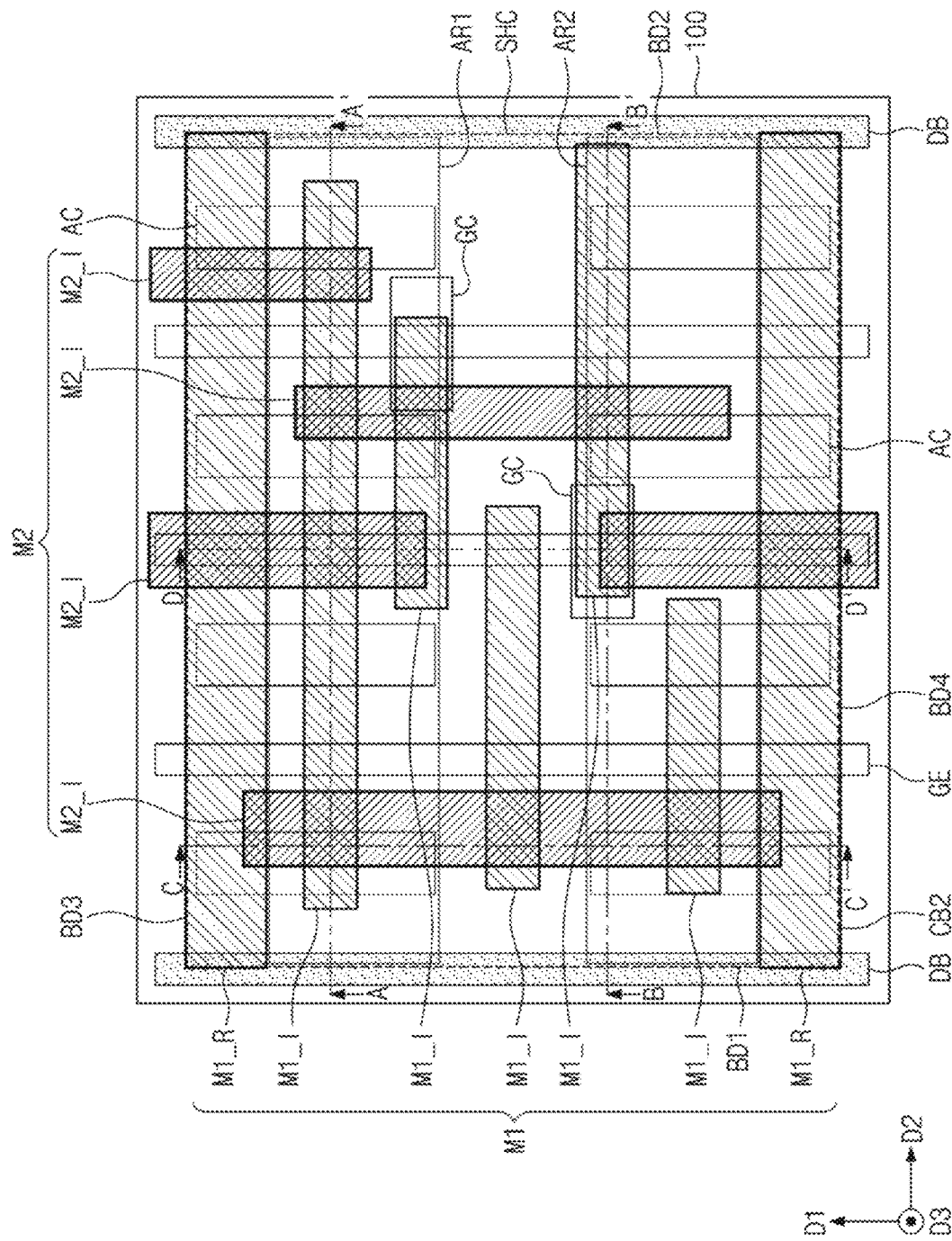
FIG. 4 is a plan view illustrating a semiconductor device according to some example embodiments of the inventive concepts.
Figure 5A:
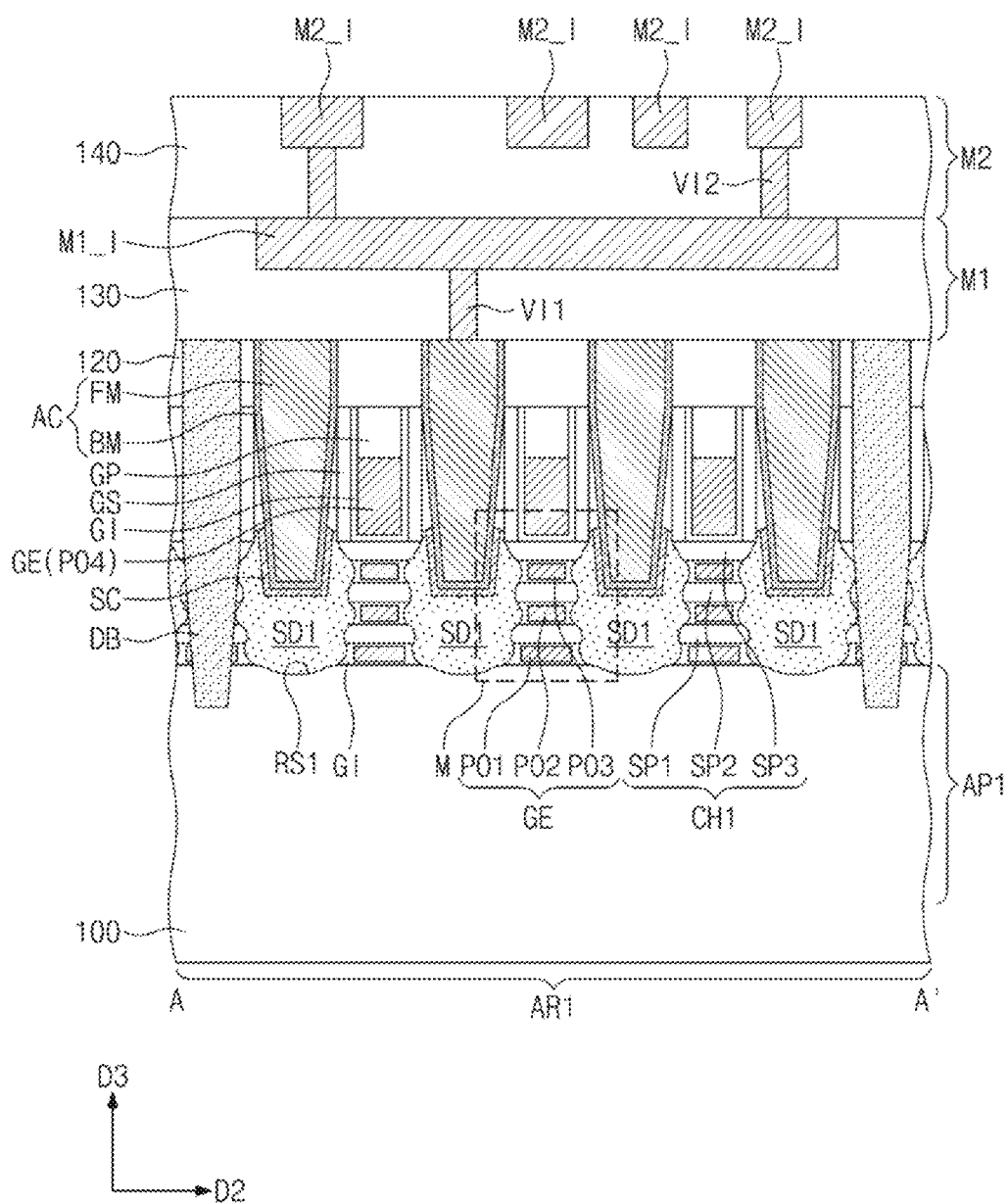
FIGS. 5A, 5B, 5C, and 5D are sectional views taken along lines A-A', B-B', C-C', and D-D', respectively, of FIG. 4.
Figure 5B:
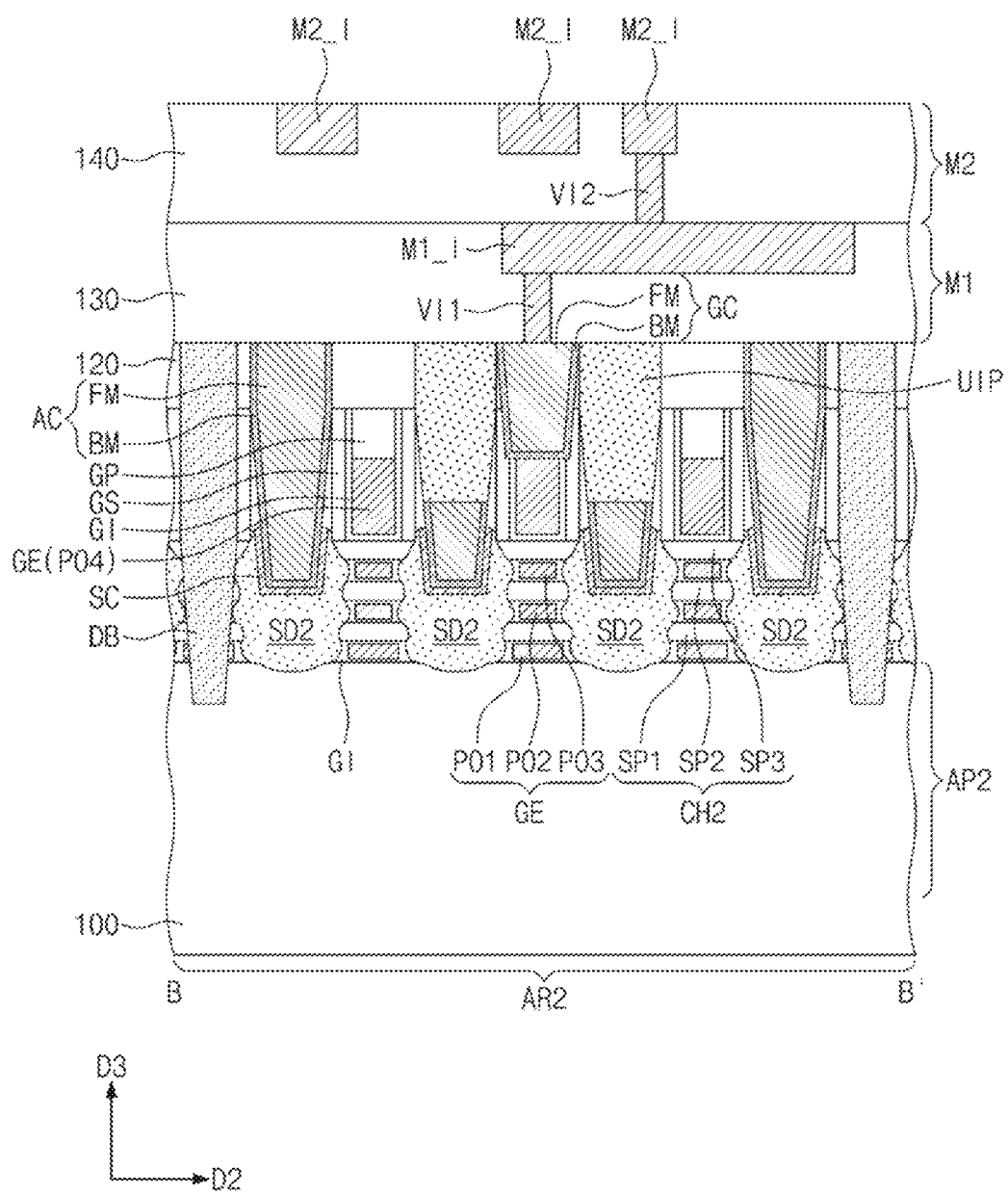
Figure 5C:
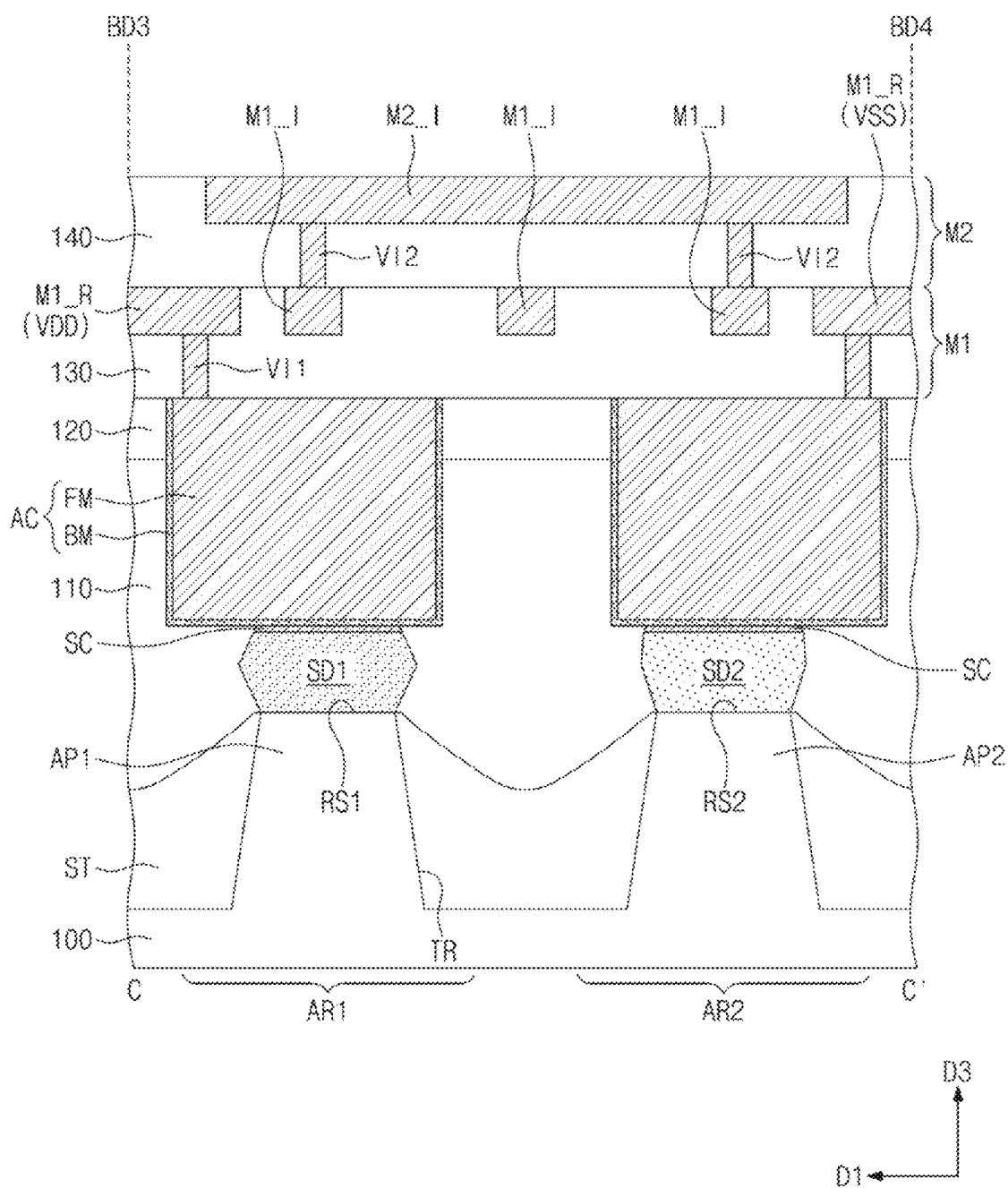

FIG. 4 is a plan view illustrating a semiconductor device according to some example embodiments of the inventive concepts. FIGS. 5A, 5B, 5C, and 5D are sectional views taken along lines A-A', B-B', C-C', and D-D', respectively, of FIG. 4. FIG. 6A is an enlarged sectional view illustrating a portion 'M' of FIG. 5A. FIG. 6B is an enlarged sectional view illustrating a portion 'N' of FIG. 5D. The semiconductor device of FIGS. 4 and 5A to 5D may be a concrete example of the single height cell SHC of FIG. 1.

Referring to FIGS. 4, 5A, 5B, 5C, and 5D, the single height cell SHC may be provided on the substrate 100. Logic transistors constituting a logic circuit may be disposed on the single height cell SHC. The substrate 100 may be a semiconductor substrate that is formed of or includes silicon, germanium, silicon germanium, a compound semiconductor material, or the like. In some example embodiments, the substrate 100 may be a silicon wafer.

The substrate 100 may include the first active region AR1 and the second active region AR2. Each of the first and second active regions AR1 and AR2 may be extended in the second direction D2. In some example embodiments, the first active region AR1 may be an NMOSFET region, and the second active region AR2 may be a PMOSFET region.

A first active pattern AP1 and a second active pattern AP2 may be defined by a trench TR, which is formed in an upper portion of the substrate 100. The first active pattern AP1 may be provided on the first active region AR1, and the second active pattern AP2 may be provided on the second active region AR2. The first and second active patterns AP1 and AP2 may be extended in the second direction D2. Each of the first and second active patterns AP1 and AP2 may be a vertically-protruding portion of the substrate 100.

A device isolation layer ST may be provided on the substrate 100. The device isolation layer ST may be provided to fill the trench TR. The device isolation layer ST may include a silicon oxide layer. The device isolation layer ST may not cover first and second channel patterns CH1 and CH2 to be described below.

In some example embodiments, the first direction D1 may be understood to extend in parallel to a top surface 100s of the substrate 100, the second direction D2 may be understood to extend in parallel to the top surface 100s of the substrate 100 and perpendicular to the first direction D1, and the third direction D3 may be understood to extend perpendicular to the top surface 100s of the substrate 100 and extend perpendicular to both the first and second directions D1 and D2.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be formed of or include at least one of silicon (Si), germanium (Ge), or silicon germanium (SiGe). For example, each of the first to third semiconductor patterns SP1, SP2, and SP3 may be formed of or include crystalline silicon.

A plurality of first source/drain patterns SD1 may be provided on the first active pattern AP1. A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., n-type). The first channel pattern CH1 may be interposed between each pair of the first source/drain patterns SD1. In other words, each pair of the first source/drain patterns SD1 may be connected to each other by the stacked first to third semiconductor patterns SP1, SP2, and SP3.

A plurality of second source/drain patterns SD2 may be provided on the second active pattern AP2. A plurality of second recesses RS2 may be formed in an upper portion of the second active pattern AP2. The second source/drain patterns SD2 may be provided in the second recesses RS2, respectively. The second source/drain patterns SD2 may be impurity regions of a second conductivity type (e.g., p-type). The second channel pattern CH2 may be interposed between each pair of the second source/drain patterns SD2. In other words, each pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. In some example embodiments, each of the first and second source/drain patterns SD1 and SD2 may have a top surface that is higher than a top surface of the third semiconductor pattern SP3. In some example embodiments, a top surface of at least one of the first and second source/drain patterns SD1 and SD2 may be located at substantially the same level as the top surface of the third semiconductor pattern SP3.

In some example embodiments, the first source/drain patterns SD1 may be formed of or include the same semiconductor element (e.g., Si) as the substrate 100. The second source/drain patterns SD2 may include a semiconductor material (e.g., SiGe) whose lattice constant is greater than that of the substrate 100. In this case, the pair of the second source/drain patterns SD2 may exert a compressive stress on the second channel pattern CH2 therebetween.

A side surface of each of the first and second source/drain patterns SD1 and SD2 may have an uneven or embossing shape. In other words, the side surface of each of the first and second source/drain patterns SD1 and SD2 may have a wavy profile, which may be understood to be a continuous wave profile (e.g., a sinusoidal wave) wherein the side surface varies in a horizontal direction (e.g., the second direction D2 as shown in FIG. 6A) as the side surface extends in the vertical direction (e.g., the third direction D3), for example varies according to a waveform. For example, the side surface of each of the first and second source/drain patterns SD1 and SD2 may have a wavy profile such that a position of the side surface oscillates perpendicularly to the third direction D3 (e.g., oscillates in the second direction D2) as the side surface of the source/drain pattern extends in the third direction D3. The side surface of each of the first and second source/drain patterns SD1 and SD2 may protrude toward first to third portions PO1, PO2, and PO3 of a gate electrode GE, which will be described below.

Gate electrodes GE may be provided to cross the first and second channel patterns CH1 and CH2 and to extend in the first direction D1. The gate electrodes GE may be arranged at a first pitch in the second direction D2. Each of the gate electrodes GE may be vertically overlapped with the first and second channel patterns CH1 and CH2.

The gate electrode GE may include a first portion PO1 interposed between the active pattern AP1 or AP2 and the first semiconductor pattern SP1, a second portion PO2 interposed between the first and second semiconductor patterns SP1 and SP2, a third portion PO3 interposed between the second and third semiconductor patterns SP2 and SP3, and a fourth portion PO4 on the third semiconductor pattern SP3.

Figure 5D:
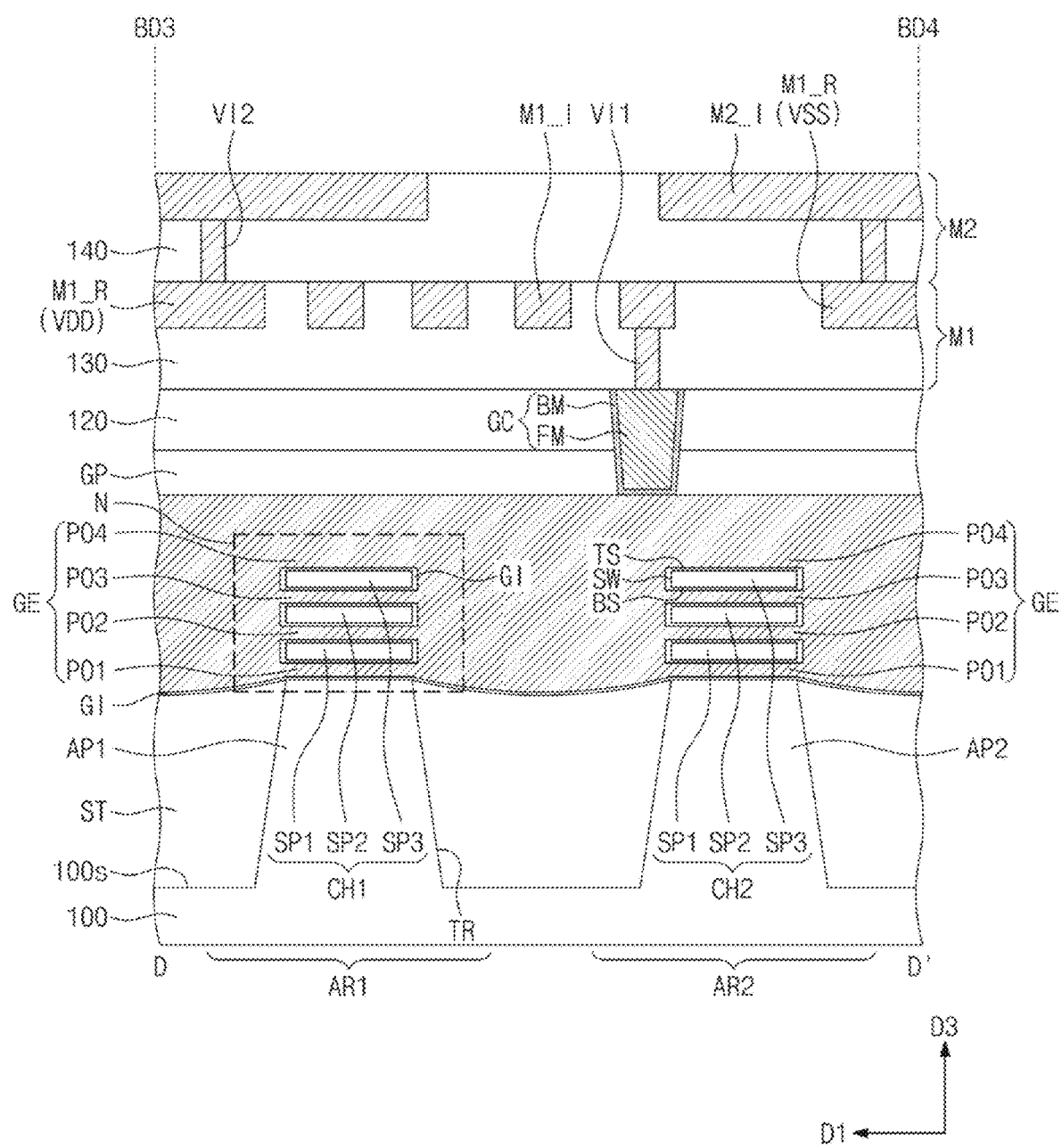
Figure 6A:
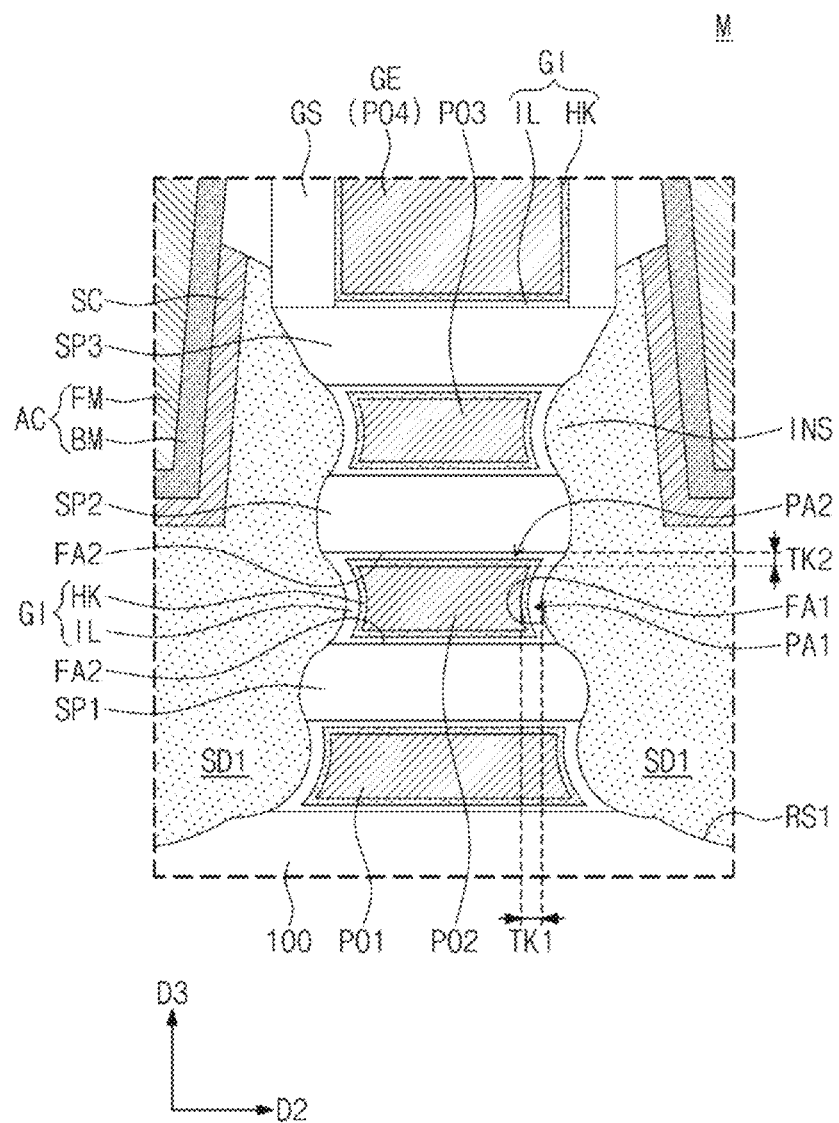
FIG. 6A is an enlarged sectional view illustrating a portion 'M' of FIG. 5A.
Figure 6B:
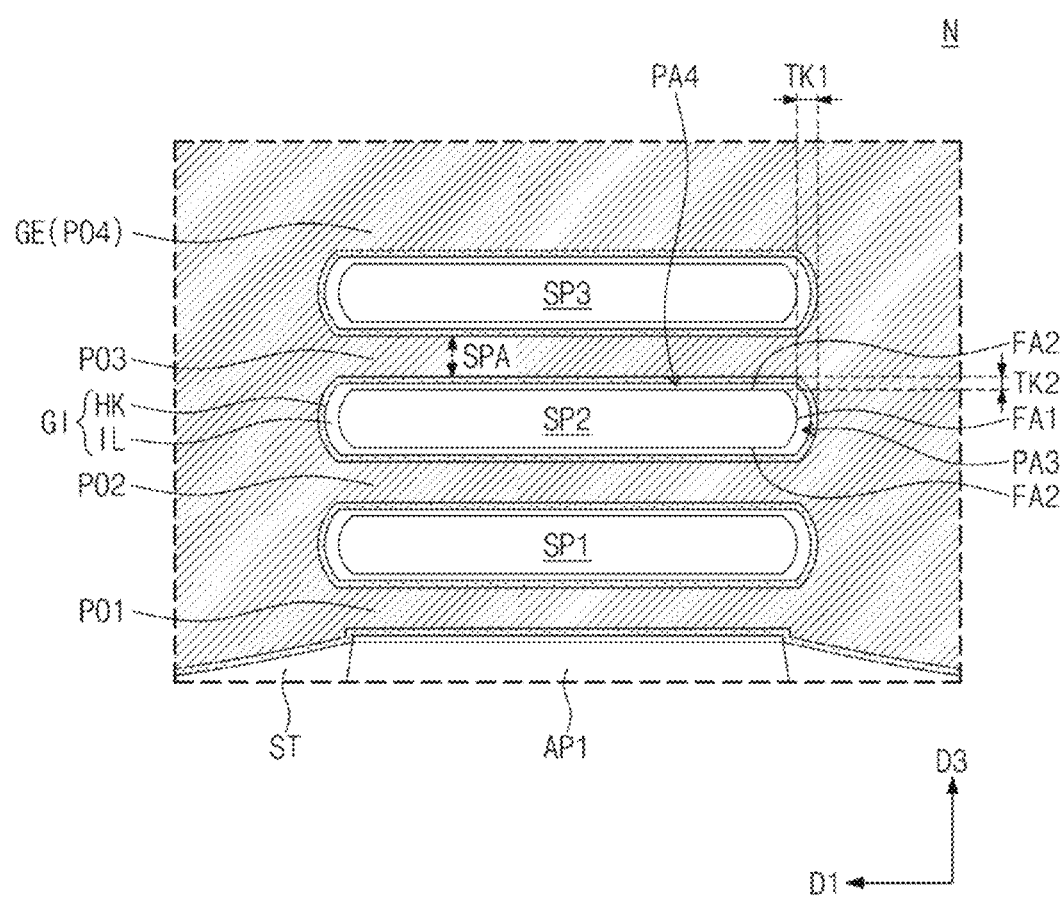
FIG. 6B is an enlarged sectional view illustrating a portion 'N' of FIG. 5D.

Referring to FIG. 5D, the gate electrode GE may be provided on a top surface TS, a bottom surface BS, and opposite side surfaces SW of each of the first to third semiconductor patterns SP1, SP2, and SP3. That is, the transistor according to some example embodiments may be a three-dimensional field effect transistor (e.g., MBCFET or GAAFET) in which the gate electrode GE is provided to three-dimensionally surround the channel pattern.

Referring back to FIGS. 4 and 5A to 5D, a pair of gate spacers GS may be respectively disposed on opposite side surfaces of the fourth portion PO4 of the gate electrode GE. The gate spacers GS may be extended along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. In some example embodiments, the gate spacers GS may be formed of or include at least one of SiCN, SiCON, or SiN. In some example embodiments, the gate spacers GS may be a multi-layered structure, which is formed of or includes at least two different materials selected from SiCN, SiCON, and SiN. For example, as illustrated in FIG. 6, the gate spacer GS may include a first spacer GS1 and a second spacer GS2.

A gate capping pattern GP may be provided on the gate electrode GE. The gate capping pattern GP may be extended along the gate electrode GE or in the first direction D1. The gate capping pattern GP may be formed of or include a material having an etch selectivity with respect to first and second interlayer insulating layers 110 and 120, which will be described below. In detail, the gate capping pattern GP may be formed of or include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the opposite side surfaces SW of each of the first to third semiconductor patterns SP1, SP2, and SP3. The gate insulating layer GI may cover a top surface of the device isolation layer ST below the gate electrode GE.

In some example embodiments, referring to FIGS. 6A and 6B, the gate insulating layer GI may include an interface layer IL and a high-k dielectric layer HK. The interface layer IL may include a silicon oxide layer or a silicon oxynitride layer. The high-k dielectric layer HK may be formed of or include a high-k dielectric material whose dielectric constant is higher than silicon oxide. As an example, the high-k dielectric layer HK may be formed of or include at least one of, for example, hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In some example embodiments, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percentage). Here, the content of the dopants (e.g., aluminum atoms) may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concepts is not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In some example embodiments, the ferroelectric layer may have a thickness ranging from 0.5 to 10 nm, but the inventive concepts is not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

Referring back to FIGS. 4 and 5A to 5D, the gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work-function metal.

The first metal pattern may include a metal nitride layer. For example, the first metal pattern may include a layer that is composed of at least one metallic material, which is selected from the group consisting of titanium (Ti), tantalum (Ta), aluminum (Al), tungsten (W) and molybdenum (Mo), and nitrogen (N). In some example embodiments, the first metal pattern may further include carbon (C). The first metal pattern may include a plurality of work function metal layers which are stacked.

The second metal pattern may be formed of or include a metallic material whose resistance is lower than the first metal pattern. For example, the second metal pattern may be formed of or include at least one metallic material, which is selected from the group consisting of tungsten (W), aluminum (Al), titanium (Ti), and tantalum (Ta). The fourth portion PO4 of the gate electrode GE may include the first metal pattern and the second metal pattern on the first metal pattern.

A first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. A third interlayer insulating layer 130 may be provided on the second interlayer insulating layer 120. A fourth interlayer insulating layer 140 may be provided on the third interlayer insulating layer 130. In some example embodiments, at least one of the first to fourth interlayer insulating layers 110 to 140 may include a silicon oxide layer.

The single height cell SHC may have a first border BD1 and a second border BD2, which are opposite to each other in the second direction D2. The first and second borders BD1 and BD2 may be extended in the first direction D1. The single height cell SHC may have a third border BD3 and a fourth border BD4, which are opposite to each other in the first direction D1. The third and fourth borders BD3 and BD4 may be extended in the second direction D2.

A pair of division structures DB, which are opposite to each other in the second direction D2, may be provided at both sides of the single height cell SHC. For example, the pair of the division structures DB may be respectively provided on the first and second borders BD1 and BD2 of the single height cell SHC. The division structure DB may be extended in the first direction D1 to be parallel to the gate electrodes GE. A pitch between the division structure DB and the gate electrode GE adjacent thereto may be equal to the first pitch.

The division structure DB may be provided to penetrate the first and second interlayer insulating layers 110 and 120 and may be extended into the first and second active patterns AP1 and AP2. The division structure DB may be provided to penetrate an upper portion of each of the first and second active patterns AP1 and AP2. The division structure DB may electrically separate an active region of each of the single height cell SHC from an active region of a neighboring cell.

Active contacts AC may be provided to penetrate the first and second interlayer insulating layers 110 and 120 and to be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern that is extended in the first direction D1.

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. Although not shown, the active contact AC may cover a portion of the top surface of the gate capping pattern GP.

Metal-semiconductor compound layers SC (e.g., silicide layers) may be respectively interposed between the active contact AC and the first source/drain pattern SD1 and between the active contact AC and the second source/drain pattern SD2. The active contact AC may be electrically connected to the source/drain pattern SD1 or SD2 through the metal-semiconductor compound layer SC. For example, the metal-semiconductor compound layer SC may be formed of or include at least one of titanium silicide, tantalum silicide, tungsten silicide, nickel silicide, or cobalt silicide.

Gate contacts GC may be provided to penetrate the second interlayer insulating layer 120 and the gate capping pattern GP and to be electrically connected to the gate electrodes GE, respectively. When viewed in a plan view, the gate contacts GC may be disposed to be respectively overlapped with the first and second active regions AR1 and AR2. As an example, the gate contact GC may be provided on the second active pattern AP2 (e.g., see FIG. 5B).

In some example embodiments, referring to FIG. 5B, an upper portion of the active contact AC adjacent to the gate contact GC may be filled with an upper insulating pattern UIP. A bottom surface of the upper insulating pattern UIP may be lower than a bottom surface of the gate contact GC. In other words, a top surface of the active contact AC adjacent to the gate contact GC may be formed at a level, which is lower than the bottom surface of the gate contact GC, by the upper insulating pattern UIP. Accordingly, it may be possible to prevent the gate contact GC and the active contact AC, which are adjacent to each other, from being in contact with each other and thereby to prevent a short circuit issue from occurring therebetween.

Each of the active and gate contacts AC and GC may include a conductive pattern FM and a barrier pattern BM enclosing the conductive pattern FM. For example, the conductive pattern FM may be formed of or include at least one of metallic materials (e.g., aluminum, copper, tungsten, molybdenum, and cobalt). The barrier pattern BM may be provided to cover side and bottom surfaces of the conductive pattern FM. In some example embodiments, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in the third interlayer insulating layer 130. For example, the first metal layer M1 may include the first power line M1_R1, the second power line M1_R2, and first interconnection lines M1_I. Each of the interconnection lines M1_R1, M1_R2, and M1_I of the first metal layer M1 may be extended in the second direction D2 and parallel to each other.

In detail, the first and second power lines M1_R1 and M1_R2 may be respectively provided on the third and fourth borders BD3 and BD4 of the single height cell SHC. The first power line M1_R1 may be extended along the third border BD3 and in the second direction D2. The second power line M1_R2 may be extended along the fourth border BD4 and in the second direction D2.

The first interconnection lines M1_I of the first metal layer M1 may be disposed between the first and second power lines M1_R1 and M1_R2. The first interconnection lines M1_I of the first metal layer M1 may be arranged at a second pitch in the first direction D1. The second pitch may be smaller than the first pitch. A linewidth of each of the first interconnection lines M1_I may be smaller than a linewidth of each of the first and second power lines M1_R1 and M1_R2.

The first metal layer M1 may further include first vias VI1. The first vias VI1 may be respectively disposed below the interconnection lines M1_R1, M1_R2, and M1_I of the first metal layer M1. The active contact AC and the interconnection line of the first metal layer M1 may be electrically connected to each other through the first via VI1. The gate contact GC and the interconnection line of the first metal layer M1 may be electrically connected to each other through the first via VI1.

The interconnection line of the first metal layer M1 and the first via VI1 thereunder may be formed by separate processes. For example, the interconnection line and the first via VI1 of the first metal layer M1 may be independently formed by respective single damascene processes. The semiconductor device according to some example embodiments may be fabricated using a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern that is extended in the first direction D1. In other words, the second interconnection lines M2_I may be extended in the first direction D1 and parallel to each other.

The second metal layer M2 may further include second vias VI2, which are respectively provided below the second interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the first metal layer M1 may be formed of or include a conductive material that is the same as or different from those of the second metal layer M2. For example, the interconnection lines of the first and second metal layers M1 and M2 may be formed of or include at least one of metallic materials (e.g., aluminum, copper, tungsten, ruthenium, molybdenum, and cobalt). Although not shown, a plurality of metal layers (e.g., M3, M4, M5, and so forth) may be additionally stacked on the fourth interlayer insulating layer 140. Each of the stacked metal layers may include interconnection lines, which are used as routing paths between cells.

The gate insulating layer GI will be described in more detail with reference to FIGS. 6A and 6B. First, referring to FIG. 6A, each of the first to third portions PO1, PO2, and PO3 of the gate electrode GE may have a concave side surface. The concave side surfaces of the first to third portions PO1, PO2, and PO3 may correspond to protruding portions of the side surface of the first source/drain pattern SD1.

In some example embodiments, the first to third portions PO1, PO2, and PO3 may have different widths from each other. For example, the largest width of the third portion PO3 in the second direction D2 may be greater than the largest width of the second portion PO2 in the second direction D2. The largest width of the first portion PO1 in the second direction D2 may be greater than the largest width of the third portion PO3 in the second direction D2.

As an example, the second portion PO2 of the gate electrode GE and the gate insulating layer GI enclosing the second portion PO2 will be described below. The gate insulating layer GI may be interposed between the second portion PO2 and the first semiconductor pattern SP1, between the second portion PO2 and the second semiconductor pattern SP2, and between the second portion PO2 and the first source/drain pattern SD1.

The gate insulating layer GI may include the interface layer IL and the high-k dielectric layer HK. The interface layer IL may be provided to directly cover the first semiconductor pattern SP1, the second semiconductor pattern SP2, and the first source/drain pattern SD1. The high-k dielectric layer HK may be interposed between the interface layer IL and the second portion PO2. The high-k dielectric layer HK may be provided to directly cover a surface of the second portion PO2.

A thickness of the gate insulating layer GI may be a sum of a thickness of the interface layer IL and a thickness of the high-k dielectric layer HK. A thickness of the gate insulating layer GI in a horizontal direction (e.g., the second direction D2) may be a first thickness TK1. A thickness of the gate insulating layer GI in a vertical direction (e.g., the third direction D3) may be a second thickness TK2. The first thickness TK1 and the second thickness TK2 may be different from each other. The first thickness TK1 may be greater than the second thickness TK2. A ratio TK2/TK1 of the second thickness TK2 to the first thickness TK1 may range from 0.3 to 0.8.

In some example embodiments, the high-k dielectric layer HK may have a uniform thickness. However, the thickness of the interface layer IL may be greater in the horizontal direction than in the vertical direction. Due to this difference in the thickness of the interface layer IL, the first thickness TK1 of the gate insulating layer GI may be greater than the second thickness TK2.

The gate insulating layer GI may include a first region PA1, which is provided on a first facet FA1 of the first source/drain pattern SD1 and has the first thickness TK1. As shown, the first region PA1 of the gate insulating layer GI may directly cover a side surface of the first source/drain pattern SD1. The first facet FA1 of the first source/drain pattern SD1 may be a crystallographic plane (e.g., a first crystallographic plane) normal to the second direction D2. For example, the first facet FA1 may be a {1 1 0} crystallographic plane.

The gate insulating layer GI may include a second region PA2, which is provided on a second facet FA2 of each of the first and second semiconductor patterns SP1 and SP2 and has the second thickness TK2. The second facet FA2 may be a top surface of the first semiconductor pattern SP1 or a bottom surface of the second semiconductor pattern SP2. The second facet FA2 may be a crystallographic plane (e.g., a second crystallographic plane) normal to the third direction D3. For example, the second facet FA2 may be a {1 0 0} crystallographic plane.

According to some example embodiments of the inventive concepts, in a process of forming the interface layer IL, a formation rate of the interface layer IL may be higher on a {1 1 0} crystallographic plane than on a {1 0 0} crystallographic plane. Thus, a thickness (e.g., TK1) on the {1 1 0} crystallographic plane of the interface layer IL may be greater than a thickness (e.g., TK2) on the {1 0 0} crystallographic plane. According to some example embodiments of the inventive concepts, the gate insulating layer GI may be formed to have the first thickness TK1 on the first facet FA1, which is the {1 1 0} crystallographic plane, and to have the second thickness TK2 on the second facet FA2, which is the {1 0 0} crystallographic plane.

According to some example embodiments of the inventive concepts, since the first thickness TK1 of the first region PA1 of the gate insulating layer GI is greater than the second thickness TK2 of the second region PA2, it may be possible to reduce a leakage current of a transistor in an off-state. Furthermore, it may be possible to reduce a capacitance between the first to third portions PO1, PO2, and PO3 of the gate electrode GE and the first source/drain pattern SD1. That is, according to some example embodiments of the inventive concepts, by selectively increasing the thickness of the gate insulating layer GI, it may be possible to improve the electrical characteristics of the semiconductor device.

For example, the gate electrode GE may include a second portion PO2 that is between the second semiconductor pattern SP2 and another semiconductor pattern (e.g., the first semiconductor pattern SP1), the second portion PO2 of the gate electrode GE may be adjacent to the second semiconductor pattern SP2, the gate insulating layer GI may include comprises a first region PA1 between the second portion PO2 of the gate electrode GE and the first source/drain pattern SD1, which may directly cover a side surface of the first source/drain pattern SD1, and a second region PA2 between the second portion PO2 of the gate electrode GE and the other semiconductor pattern (e.g., between the second portion PO2 and a bottom surface of the second semiconductor pattern SP2), and a thickness of the first region PA1 in a horizontal direction (e.g., second direction D2) that is perpendicular to the vertical direction (e.g., third direction D3) may be greater than a thickness of the second region PA2 region in the vertical direction (e.g., third direction D3).

Referring to FIG. 6B, the first to third semiconductor patterns SP1, SP2, and SP3 may be stacked on the first active pattern AP1 to be vertically spaced apart from each other. The gate insulating layer GI may be provided to enclose each of the first to third semiconductor patterns SP1, SP2, and SP3. Hereinafter, the second semiconductor pattern SP2, which is one of the semiconductor patterns, and the gate insulating layer GI, which is provided to enclose the same, will be described in more detail below.

The gate insulating layer GI may include a third region PA3, which is provided on the side surface (e.g., the first facet FA1) of the second semiconductor pattern SP2. The gate insulating layer GI may include a fourth region PA4, which is provided on a top or bottom surface (e.g., the second facet FA2) of the second semiconductor pattern SP2.

The first facet FA1 may be a crystallographic plane normal to the first direction D1. For example, the first facet FA1 may be the {1 1 0} crystallographic plane. The second facet FA2 may be a crystallographic plane normal to the third direction D3. For example, the second facet FA2 may be the {1 0 0} crystallographic plane. For example, the side surface of the first source/drain pattern SD1 comprises a {1 1 0} crystallographic plane, and the bottom surface of the second semiconductor pattern SP2 may comprise the {1 0 0} crystallographic plane.

A thickness of the gate insulating layer GI in the horizontal direction (e.g., a thickness of the third region PA3) may be the first thickness TK1. A thickness of the gate insulating layer GI in the vertical direction (e.g., a thickness of the fourth region PA4) may be the second thickness TK2. The first thickness TK1 may be greater than the second thickness TK2.

In some example embodiments, the high-k dielectric layer HK may have a uniform thickness. Nevertheless, the thickness of the interface layer IL may be greater in the horizontal direction than in the vertical direction. Due to this difference in the thickness of the interface layer IL, the first thickness TK1 of the gate insulating layer GI may be greater than the second thickness TK2.

In some example embodiments, since the first thickness TK1 of the third region PA3 of the gate insulating layer GI is greater than the second thickness TK2 of the fourth region PA4, it may be possible to reduce a leakage current of a transistor in an on-state. When the fourth region PA4 of the gate insulating layer GI has a relatively small thickness (e.g., TK2), a space SPA between adjacent ones of the semiconductor patterns SP1-SP3 may be enlarged. In this case, the spaces SPA between the semiconductor patterns SP1-SP3 may be stably filled with the first to third portions PO1 to PO3 of the gate electrode GE. That is, according to some example embodiments of the inventive concepts, by changing the thickness of the gate insulating layer GI, it may be possible to improve the electrical and reliability characteristics of the semiconductor device.

For example, the gate insulating layer GI may include a third region PA3 on one of the opposite side surfaces of the second semiconductor pattern SP2 (e.g., first facets FA1); and a fourth region PA4 on one of the top surface of the second semiconductor pattern SP2 or the bottom surface of the second semiconductor pattern SP2, and the first thickness TK1 of the third region PA3 in the horizontal direction (e.g., first direction D1) may be greater than the second thickness TK2 of the fourth region PA4 in the vertical direction (e.g., third direction D3) that is perpendicular to the horizontal direction. For example, a thickness in the horizontal direction (e.g., first direction D1) of the interface layer IL of the third region PA3 of the gate insulating layer GI may be greater (e.g., greater in magnitude) than a thickness in the vertical direction (e.g., third direction D3) of the interface layer IL of the fourth region PA4 of the gate insulating layer GI. For example, a thickness in the horizontal direction (e.g., first direction D1) of the high-k dielectric layer HK of the third region PA3 of the gate insulating layer GI may be greater (e.g., greater in magnitude) than a thickness in the vertical direction (e.g., third direction D3) of the high-k dielectric layer HK of the fourth region PA4 of the gate insulating layer GI.

The gate insulating layer GI on the first channel pattern CH1 is exemplarily illustrated in FIGS. 6A and 6B. However, the gate insulating layer GI, which is provided not only on the first channel pattern CH1 but also on the second channel pattern CH2, may have the same features as illustrated in FIGS. 6A and 6B.

FIGS. 7A, 7B, 8A, 8B, 9A, 9B, 9C, 10A, 10B, 10C, 11A, 11B, 11C, 12A, 12B, and 12C are sectional views illustrating a method of fabricating a semiconductor device, according to some example embodiments of the inventive concepts. In detail, FIGS. 7A, 8A, 9A, 10A, 11A, and 12A are sectional views corresponding to the line A-A' of FIG. 4. FIGS. 9B, 10B, 11B, and 12B are sectional views corresponding to the line C-C' of FIG. 4. FIGS. 7B, 8B, 9C, 10C, 11C, and 12C are sectional views corresponding to the line D-D' of FIG. 4.

Figure 7A:
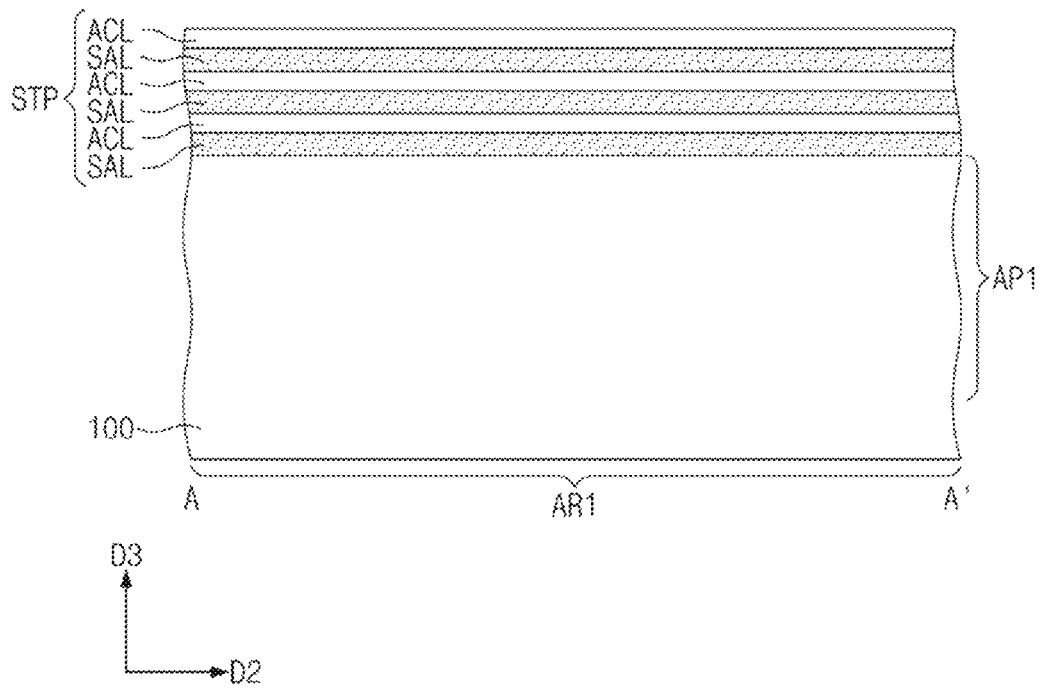
FIGS. 7A, 7B, 8A, 8B, 9A, 9B, 9C, 10A, 10B, 10C, 11A, 11B, 11C, 12A, 12B, and 12C are sectional views illustrating a method of fabricating a semiconductor device, according to some example embodiments of the inventive concepts.
Figure 7B:
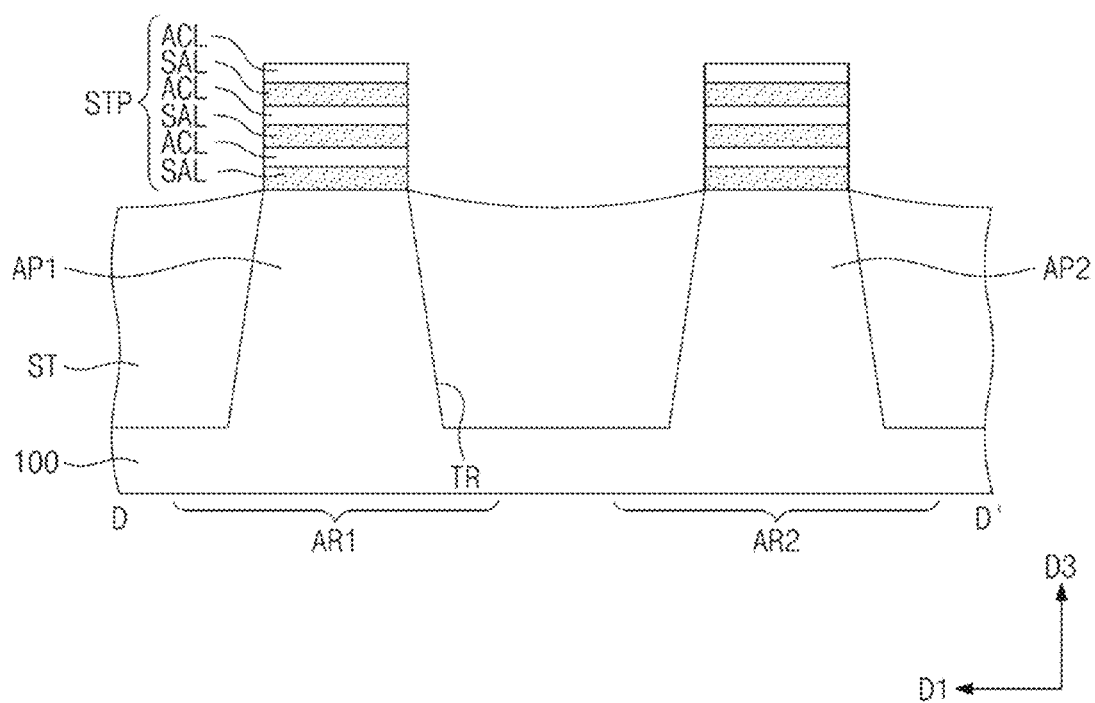

Referring to FIGS. 7A and 7B, the substrate 100 including the first and second active regions AR1 and AR2 may be provided. Active layers ACL and sacrificial layers SAL may be alternately stacked on the substrate 100. The active layers ACL may be formed of or include one of silicon (Si), germanium (Ge), and silicon germanium (SiGe), and the sacrificial layers SAL may be formed of or include another one of silicon (Si), germanium (Ge), and silicon germanium (SiGe).

The sacrificial layer SAL may be formed of or include a material having an etch selectivity with respect to the active layer ACL. For example, the active layers ACL may be formed of or include silicon (Si), and the sacrificial layers SAL may be formed of or include silicon germanium (SiGe). A germanium concentration of each of the sacrificial layers SAL may range from 10 at % to 30 at %.

Mask patterns may be respectively formed on the first and second active regions AR1 and AR2 of the substrate 100. The mask pattern may be a line- or bar-shaped pattern that is extended in the second direction D2.

A patterning process using the mask patterns as an etch mask may be performed to form the trench TR defining the first and second active patterns AP1 and AP2. The first active pattern AP1 may be formed on the first active region AR1. The second active pattern AP2 may be formed on the second active region AR2.

A stacking pattern STP may be formed on each of the first and second active patterns AP1 and AP2. The stacking pattern STP may include the active layers ACL and the sacrificial layers SAL which are alternately stacked. The stacking pattern STP may be formed along with the first and second active patterns AP1 and AP2, during the patterning process.

The device isolation layer ST may be formed to fill the trench TR. In detail, an insulating layer may be formed on the substrate 100 to cover the first and second active patterns AP1 and AP2 and the stacking patterns STP. The device isolation layer ST may be formed by recessing the insulating layer to expose the stacking patterns STP.

The device isolation layer ST may be formed of or include at least one of insulating materials (e.g., silicon oxide). The stacking patterns STP may be placed above the device isolation layer ST and may be exposed to the outside of the device isolation layer ST. In other words, the stacking patterns STP may protrude vertically above the device isolation layer ST.

Figure 8A:
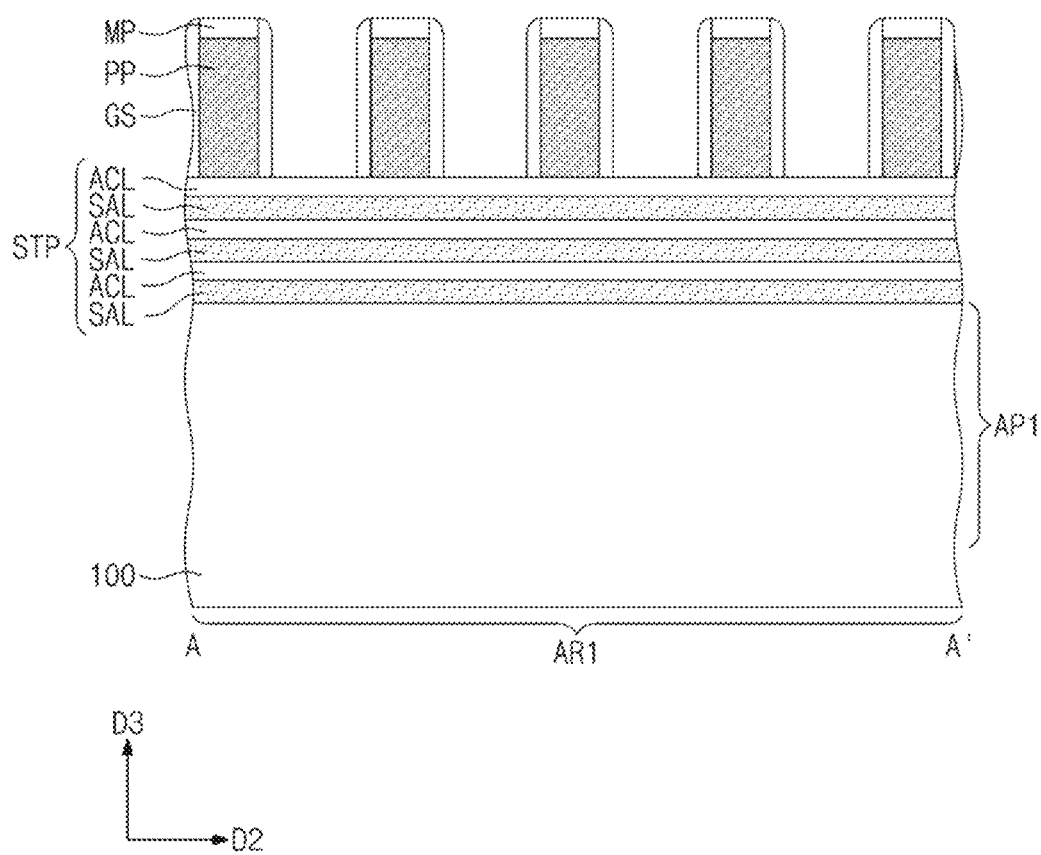
Figure 8B:
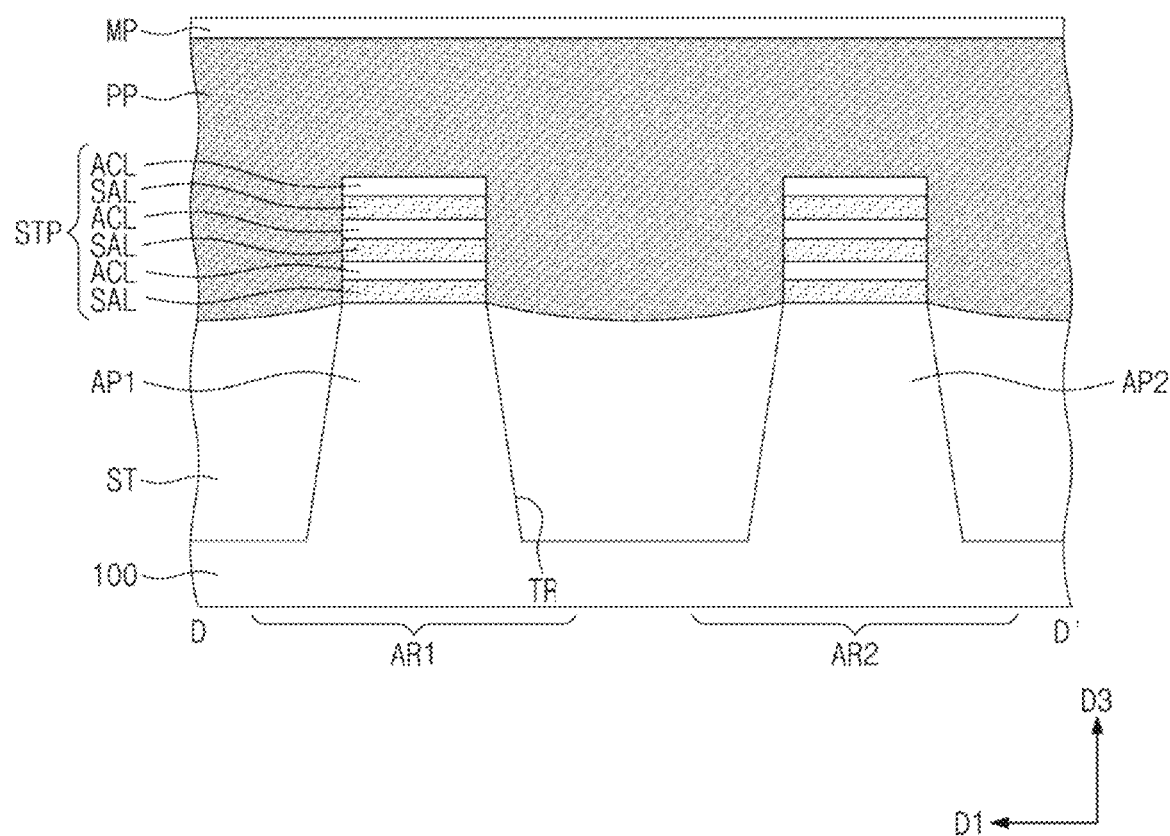

Referring to FIGS. 8A and 8B, sacrificial patterns PP may be formed on the substrate 100 to cross the stacking patterns STP. Each of the sacrificial patterns PP may be a line- or bar-shaped pattern that is extended in the first direction D1. The sacrificial patterns PP may be arranged at a first pitch in the second direction D2.

In detail, the formation of the sacrificial patterns PP may include forming a sacrificial layer on the substrate 100, forming hard mask patterns MP on the sacrificial layer, and patterning the sacrificial layer using the hard mask patterns MP as an etch mask. The sacrificial layer may be formed of or include polysilicon.

A pair of the gate spacers GS may be formed on opposite side surfaces of each of the sacrificial patterns PP. The formation of the gate spacers GS may include conformally forming a gate spacer layer on the substrate 100 and anisotropically etching the gate spacer layer. In some example embodiments, the gate spacer GS may be a multi-layered structure including at least two layers.

Figure 9A:
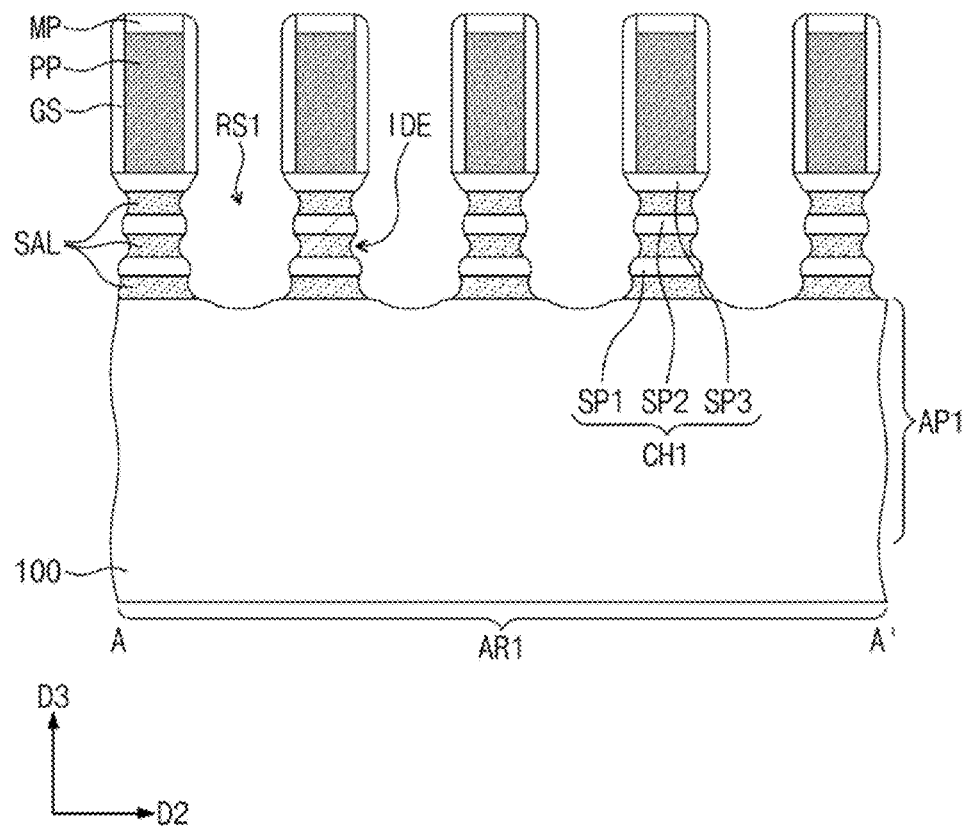
Figure 9B:
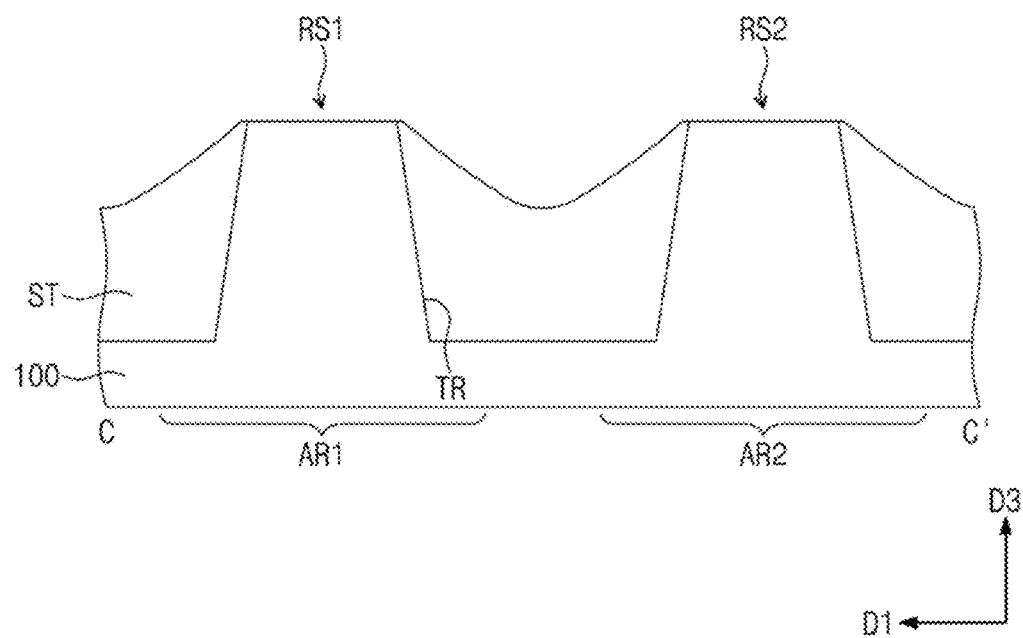
Figure 9C:
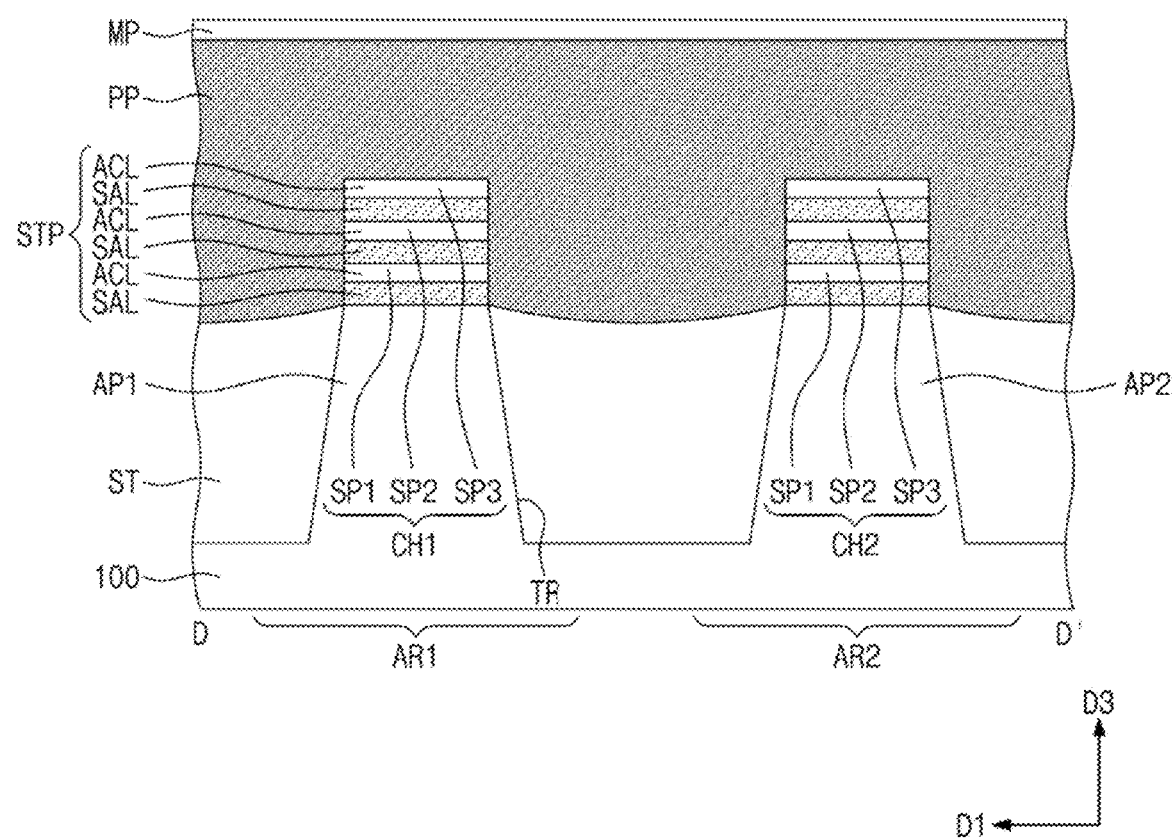

Referring to FIGS. 9A to 9C, the first recesses RS1 may be formed in the stacking pattern STP on the first active pattern AP1. The second recesses RS2 may be formed in the stacking pattern STP on the second active pattern AP2. During the formation of the first and second recesses RS1 and RS2, the device isolation layer ST may also be recessed at both sides of each of the first and second active patterns AP1 and AP2 (e.g., see FIG. 9B).

In detail, the first recesses RS1 may be formed by etching the stacking pattern STP on the first active pattern AP1 using the hard mask patterns MP and the gate spacers GS as an etch mask. The first recess RS1 may be formed between a pair of the sacrificial patterns PP. The formation of the first recess RS1 may further include performing a selective etching process on the sacrificial layers SAL exposed. Each of the sacrificial layers SAL may be indented by the selective etching process to form an indent region IDE. Thus, the first recess RS1 may have a wavy inner side surface. The second recesses RS2 in the stacking pattern STP on the second active pattern AP2 may be formed by the same method as that for the first recesses RS1.

The first to third semiconductor patterns SP1, SP2, and SP3, which are sequentially stacked between adjacent ones of the first recesses RS1, may be respectively formed from the active layers ACL. The first to third semiconductor patterns SP1, SP2, and SP3 between the adjacent ones of the first recesses RS1 may constitute the first channel pattern CH1. The first to third semiconductor patterns SP1, SP2, and SP3 between adjacent ones of the second recesses RS2 may constitute the second channel pattern CH2.

Figure 10A:
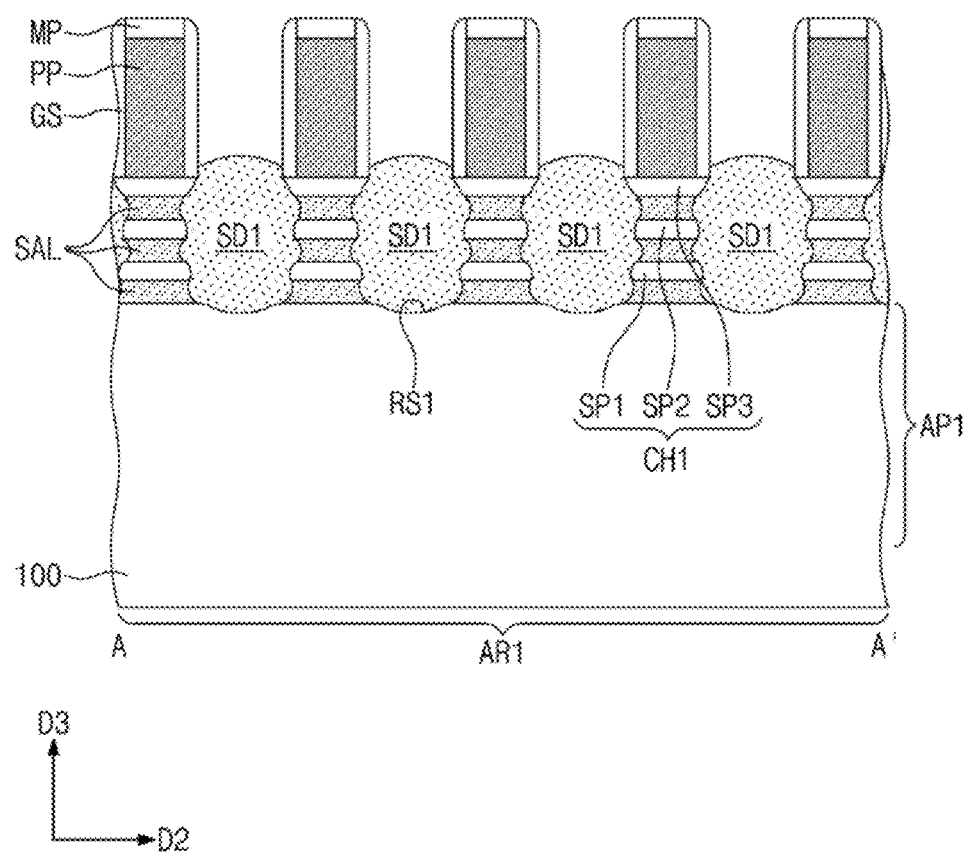
Figure 10B:
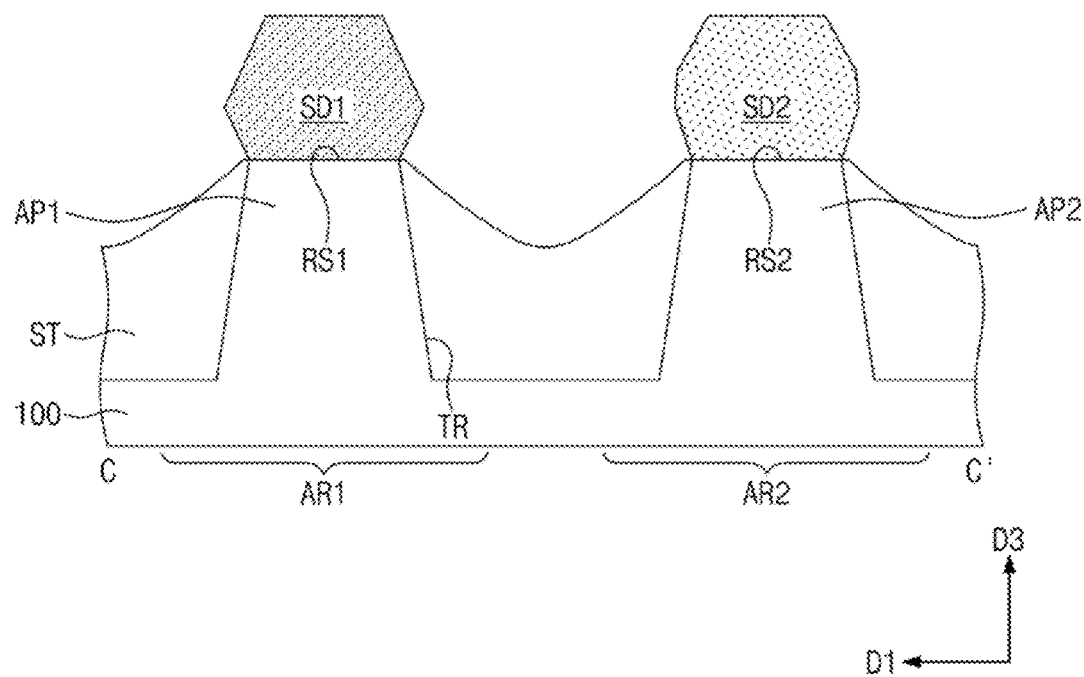
Figure 10C:
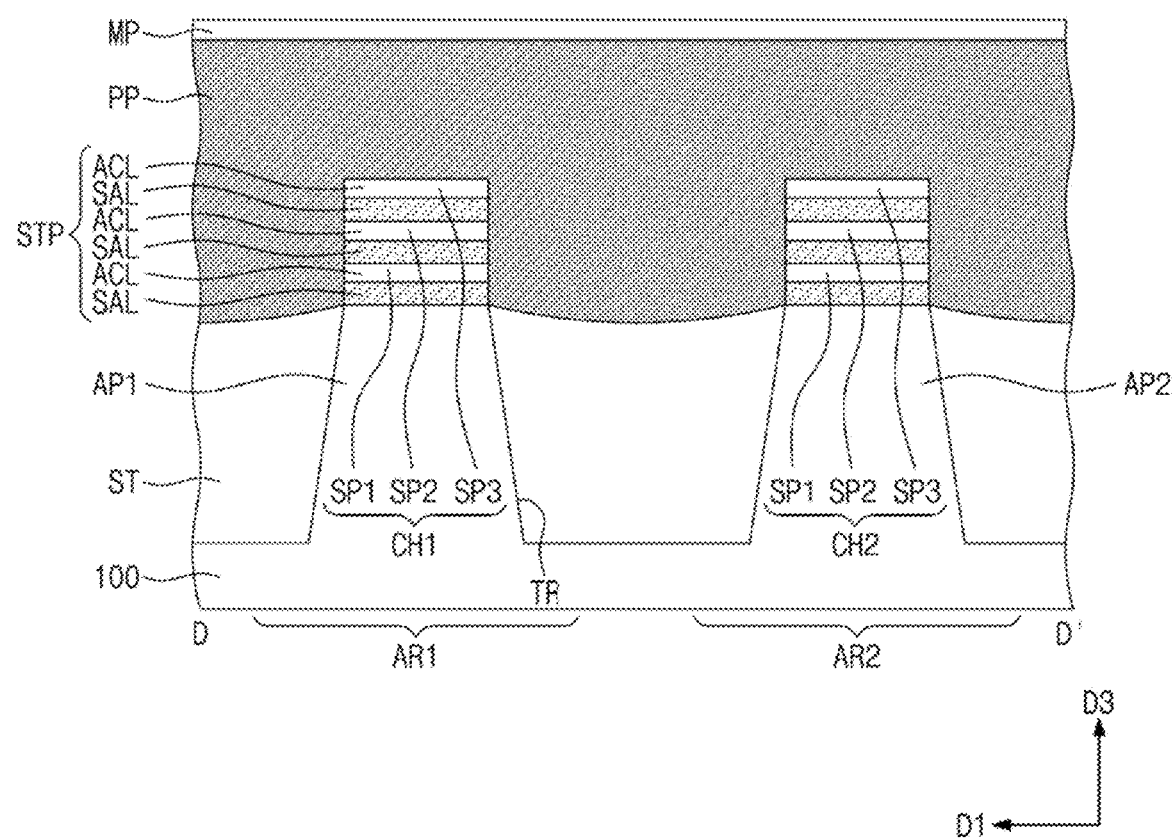

Referring to FIGS. 10A to 10C, the first source/drain patterns SD1 may be formed in the first recesses RS1, respectively. In detail, a SEG process, in which an inner surface of the first recess RS1 is used as a seed layer, may be performed to form an epitaxial layer filling the first recess RS1. The epitaxial layer may be grown using the first to third semiconductor patterns SP1, SP2, and SP3 and the substrate 100, which are exposed by the first recess RS1, as the seed layer. In some example embodiments, the SEG process may include a chemical vapor deposition (CVD) process or a molecular beam epitaxy (MBE) process.

In some example embodiments, the first source/drain pattern SD1 may be formed of or include the same semiconductor element (e.g., Si) as the substrate 100. During the formation of the first source/drain pattern SD1, the first source/drain pattern SD1 may be doped in-situ with n-type impurities (e.g., phosphorus, arsenic, or antimony). Alternatively, impurities may be injected into the first source/drain pattern SD1, after the formation of the first source/drain pattern SD1.

The second source/drain patterns SD2 may be formed in the second recesses RS2, respectively. In detail, the second source/drain pattern SD2 may be formed by a SEG process using an inner surface of the second recess RS2 as a seed layer.

In some example embodiments, the second source/drain pattern SD2 may be formed of or include a semiconductor material (e.g., SiGe) whose lattice constant is greater than that of a semiconductor material of the substrate 100. During the formation of the second source/drain pattern SD2, the second source/drain pattern SD2 may be doped in-situ with p-type impurities (e.g., boron, gallium, or indium). Alternatively, impurities may be injected into the second source/drain pattern SD2, after the formation of the second source/drain pattern SD2.

Figure 11A:
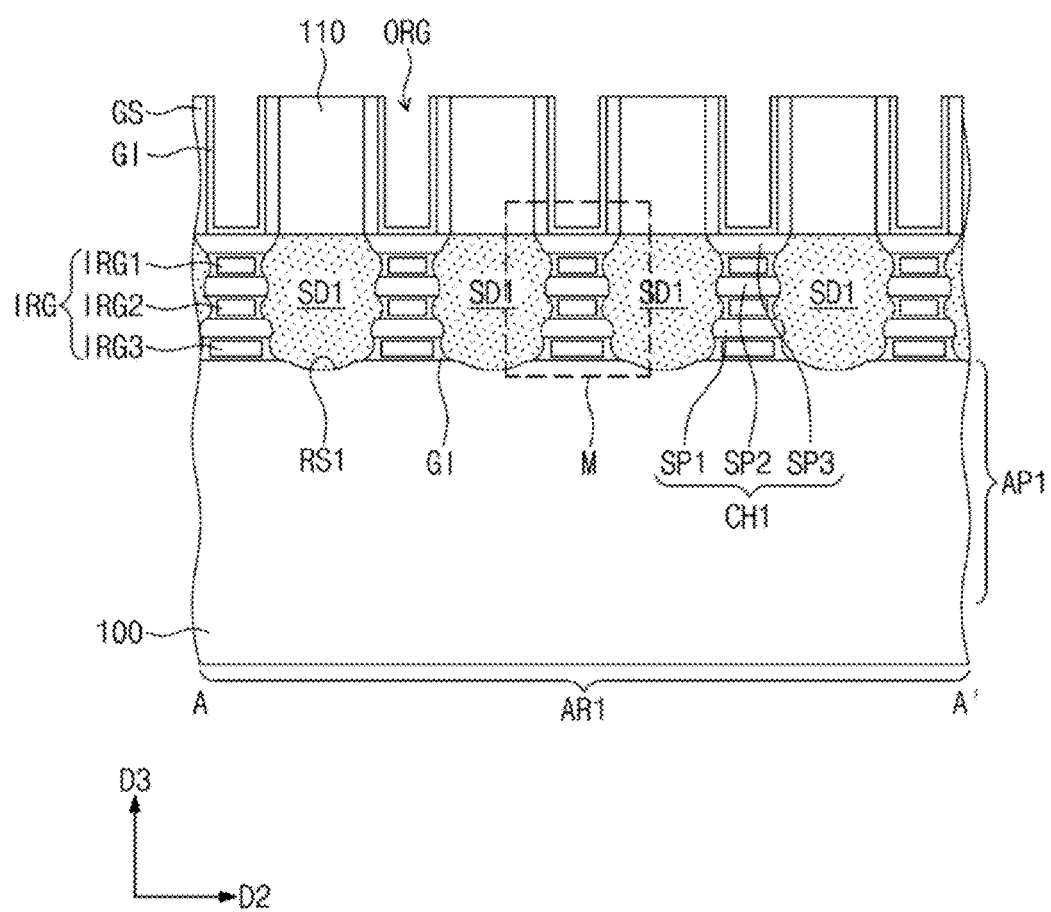
Figure 11B:
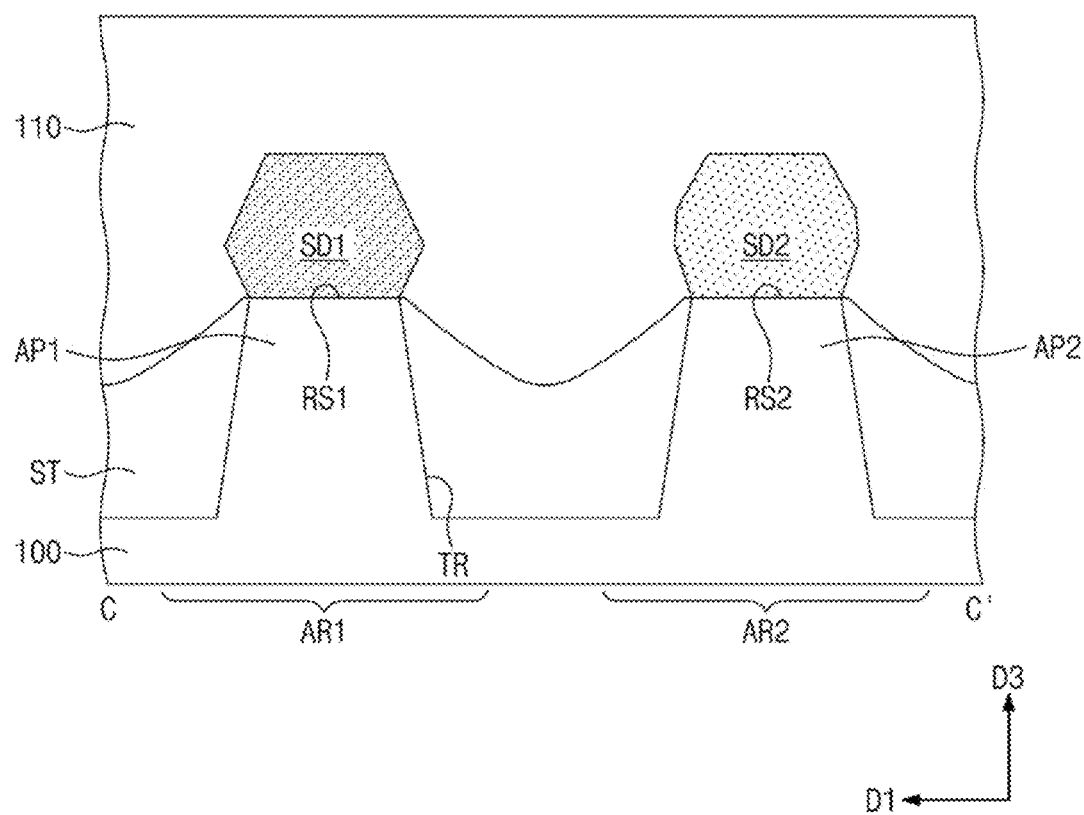
Figure 11C:
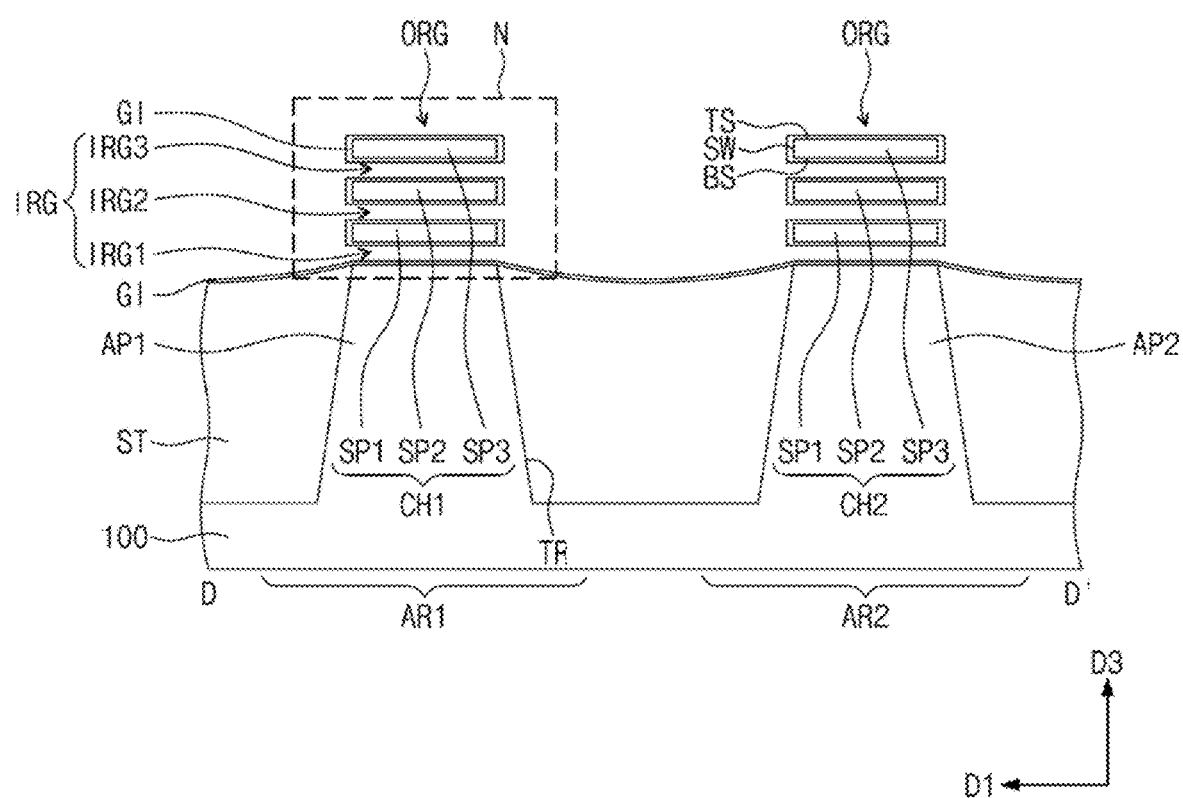

Referring to FIGS. 11A to 11C, the first interlayer insulating layer 110 may be formed to cover the first and second source/drain patterns SD1 and SD2, the hard mask patterns MP, and the gate spacers GS. In some example embodiments, the first interlayer insulating layer 110 may include a silicon oxide layer.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. All of the hard mask patterns MP may be removed during the planarization process. As a result, the first interlayered insulating layer 110 may have a top surface that is substantially coplanar the top surfaces of the sacrificial patterns PP and the top surfaces of the gate spacers GS.

The exposed sacrificial patterns PP may be selectively removed. As a result of the removal of the sacrificial patterns PP, an outer region ORG exposing the first and second channel patterns CH1 and CH2 may be formed (e.g., see FIG. 11C). The removal of the sacrificial patterns PP may include a wet etching process which is performed using etching solution capable of selectively etching polysilicon.

The sacrificial layers SAL exposed through the outer region ORG may be selectively removed to form inner regions IRG (e.g., see FIG. 11C). In detail, a process of selectively etching the sacrificial layers SAL may be performed to leave the first to third semiconductor patterns SP1, SP2, and SP3 and to remove only the sacrificial layers SAL. The etching process may be chosen to have a high etch rate for a material (e.g., SiGe) having a relatively high germanium concentration. For example, the etching process may be chosen to have a high etch rate for a silicon germanium layer whose germanium concentration is higher than 10 at %.

During the etching process, the sacrificial layers SAL on the first and second active regions AR1 and AR2 may be removed. The etching process may be a wet etching process. An etchant material, which is used in the etching process, may be chosen to quickly remove the sacrificial layer SAL having a relatively high germanium concentration.

Referring back to FIG. 11C, since the sacrificial layers SAL are selectively removed, only the stacked first to third semiconductor patterns SP1, SP2, and SP3 may be left on each of the first and second active patterns AP1 and AP2. As a result of the removal of the sacrificial layers SAL, first to third inner regions IRG1, IRG2, and IRG3 may be formed on each of the first and second active patterns AP1 and AP2.

In detail, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring back to FIGS. 11A to 11C, the gate insulating layer GI may be formed to cover exposed surfaces of the first to third semiconductor patterns SP1, SP2, and SP3. The gate insulating layer GI may be formed to enclose each of the first to third semiconductor patterns SP1, SP2, and SP3.

Figure 13A:
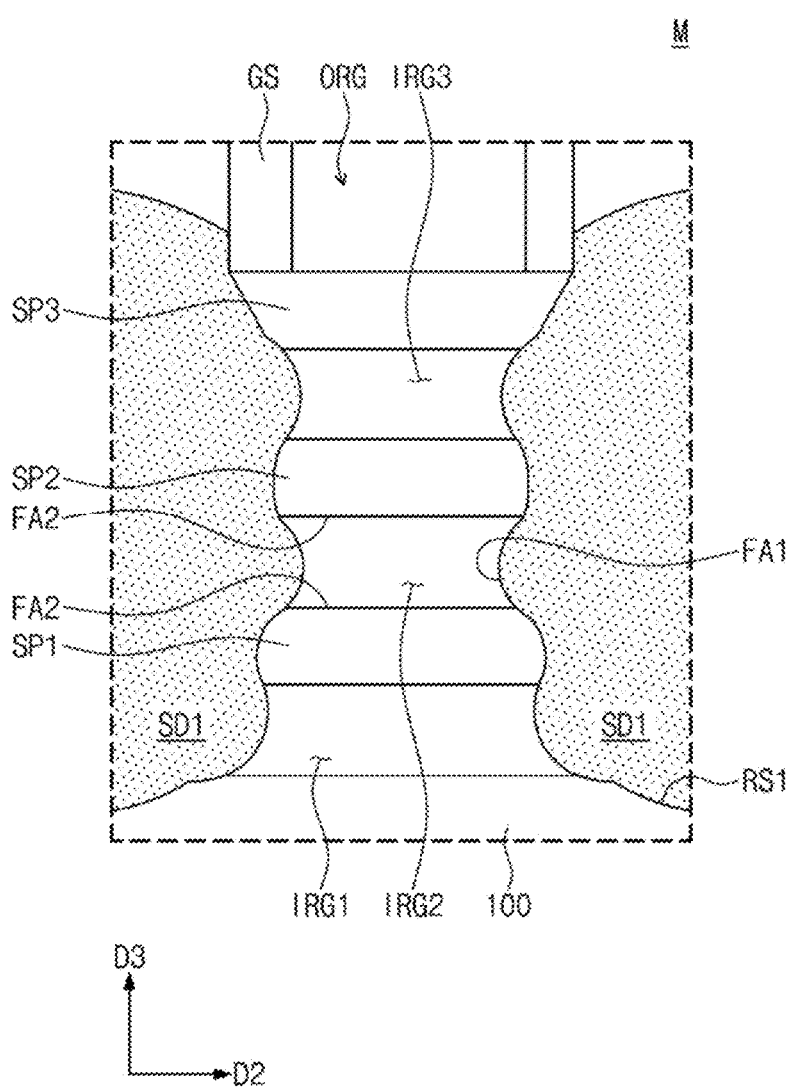
FIGS. 13A, 14A, and 15A are enlarged sectional views illustrating a method of forming a portion 'M' of FIG. 11A.
Figure 13B:
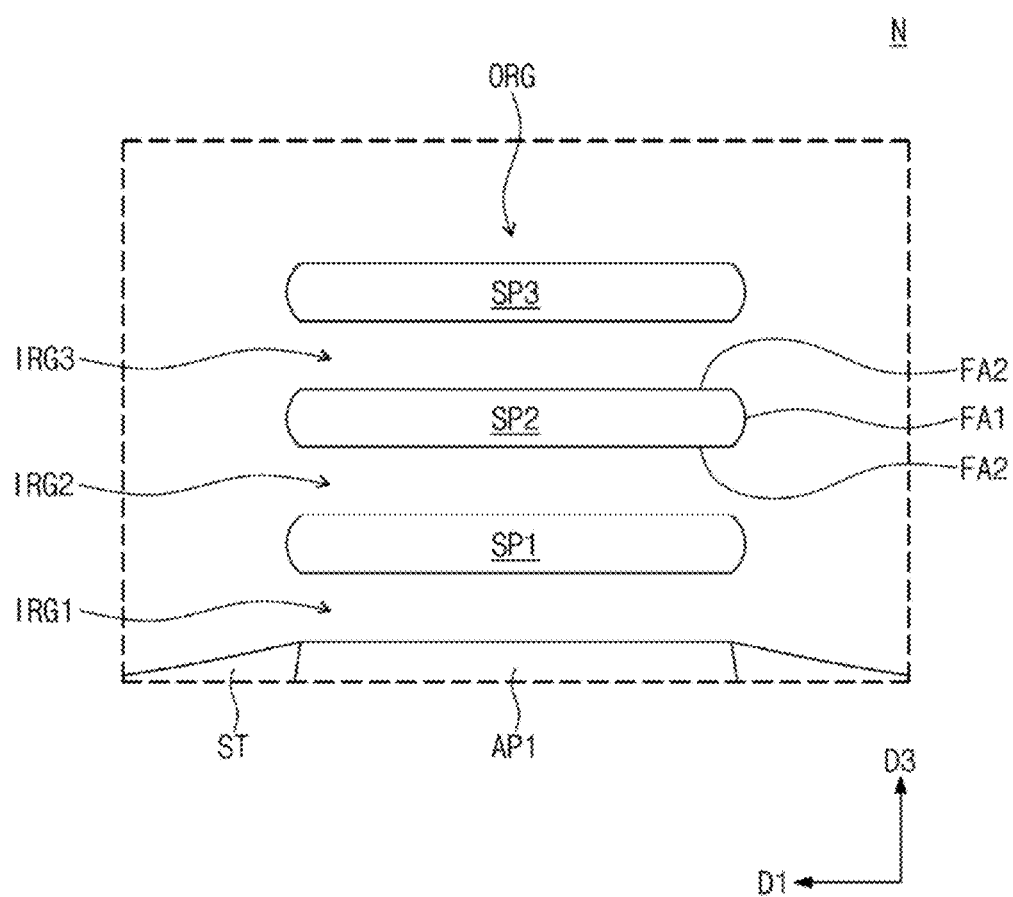
FIGS. 13B, 14B, and 15B are enlarged sectional views illustrating a method of forming a portion 'N' of FIG. 11C.
Figure 14A:
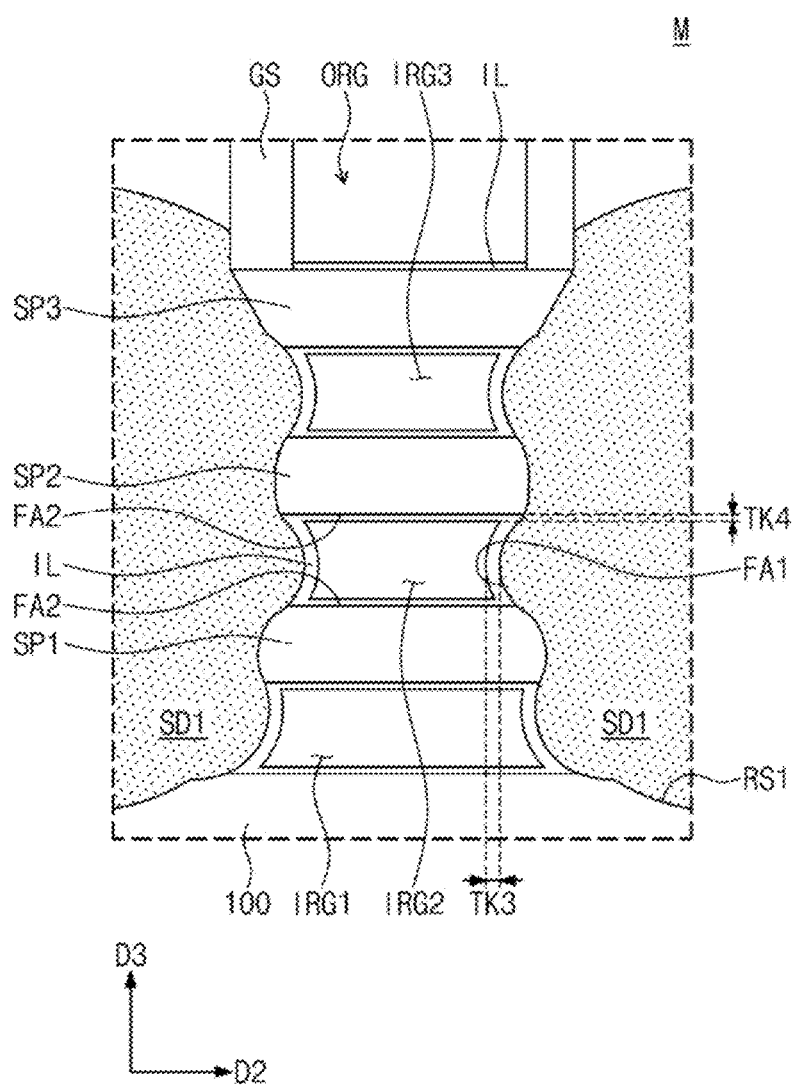
Figure 14B:
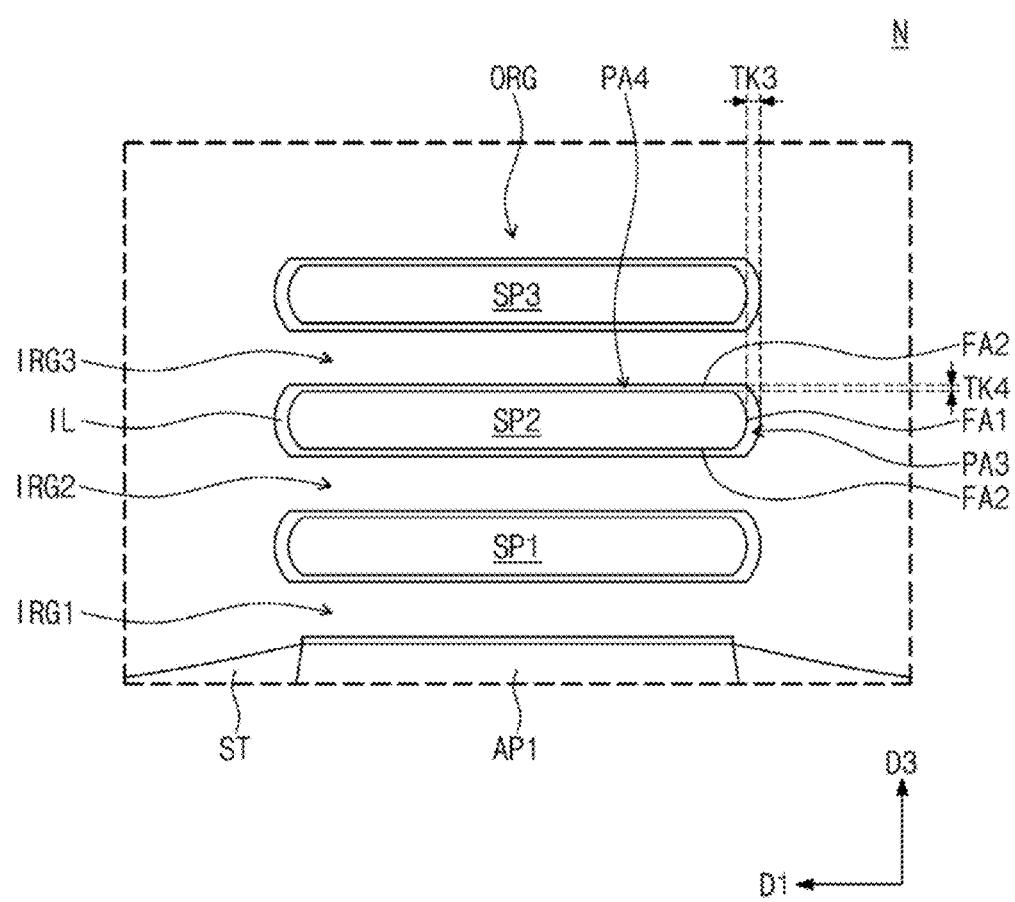
Figure 15A:
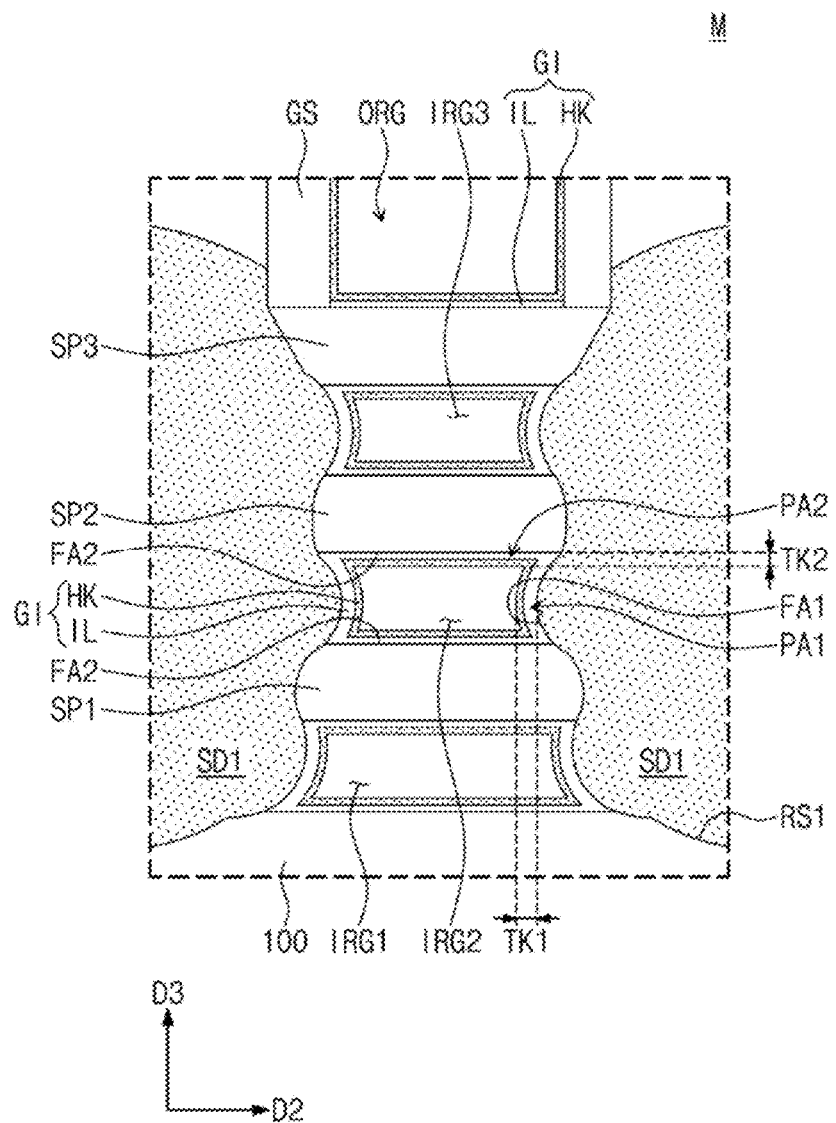
Figure 15B:
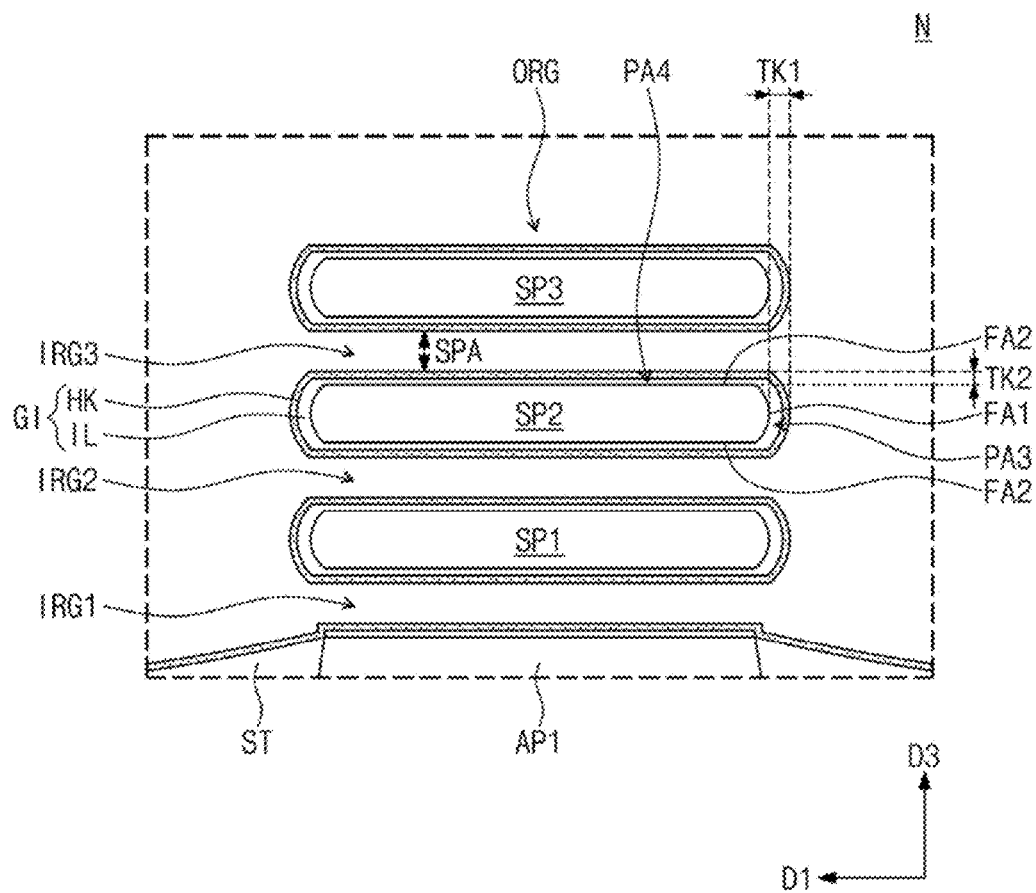

FIGS. 13A, 14A, and 15A are enlarged sectional views illustrating a method of forming a portion 'M' of FIG. 11A. FIGS. 13B, 14B, and 15B are enlarged sectional views illustrating a method of forming a portion 'N' of FIG. 11C.

Referring to FIGS. 13A and 13B, the outer region ORG may be formed by selectively removing the sacrificial pattern PP, as described above. The first to third inner regions IRG1 to IRG3 may be formed by selectively removing the sacrificial layers SAL exposed through the outer region ORG.

Referring to FIG. 13A, as a representative example, the second inner region IRG2 may expose the first facet FA1 of the first source/drain pattern SD1. The second inner region IRG2 may expose the second facets FA2 of the first and second semiconductor patterns SP1 and SP2. The first facet FA1 may be a crystallographic plane whose normal is parallel to a top surface of the substrate 100. For example, the first facet FA1 may be a {1 1 0} crystallographic plane. The second facet FA2 may be a crystallographic plane whose normal is perpendicular to the top surface of the substrate 100. For example, the second facet FA2 may be a {1 0 0} crystallographic plane.

Referring to FIG. 13B, for the second semiconductor pattern SP2 as a representative example, a top surface, a bottom surface, and opposite side surfaces may be exposed. Each of the opposite side surfaces of the second semiconductor pattern SP2 may be the first facet FA1. Each of the top and bottom surfaces of the second semiconductor pattern SP2 may be the second facet FA2.

Referring to FIGS. 14A and 14B, the interface layer IL may be formed in the outer region ORG and the first to third inner regions IRG1-IRG3. The interface layer IL may be selectively formed on the semiconductor crystallographic plane exposed by the outer region ORG and the first to third inner regions IRG1-IRG3. In some example embodiments, the interface layer IL may not be formed on the gate spacer GS. In some example embodiments, the interface layer IL may also be formed on the gate spacer GS.

The interface layer IL on the first facet FA1 may have a third thickness TK3, and the interface layer IL on the second facet FA2 may have a fourth thickness TK4. The third thickness TK3 may be greater than the fourth thickness TK4. In other words, the interface layer IL may be formed to have a thickness that depends on a crystal orientation of the semiconductor crystallographic plane.

In some example embodiments, the process of forming the interface layer IL may be controlled such that a formation rate of the interface layer IL is higher on the first facet FA1 or the {1 1 0} crystallographic plane than on the second facet FA2 or the {1 0 0} crystallographic plane. In other words, the formation rate of the interface layer IL in the horizontal direction may be controlled to be higher than the formation rate of the interface layer IL in the vertical direction. Thus, the third thickness TK3 of the interface layer IL may have a value that is greater than the fourth thickness TK4.

The process of forming the interface layer IL may include a semiconductor oxidation process and/or an oxide deposition process. As described above, the process of forming the interface layer IL may be controlled to have a difference between the formation speeds in horizontal and vertical directions.

In the present specification, the term "formation rate" or "formation speeds" may mean a growth rate or a deposition rate of the interface layer IL in the process of forming the interface layer IL. As an example, if the interface layer IL is formed by the semiconductor oxidation process, the formation rate of the interface layer IL may mean the growth rate. As another example, if the interface layer IL is formed by the oxide deposition process, the formation rate of the interface layer IL may mean the deposition rate.

Referring to FIGS. 15A and 15B, the high-k dielectric layer HK may be formed in the outer region ORG and the first to third inner regions IRG1-IRG3. The high-k dielectric layer HK may be formed on the interface layer IL. The interface layer IL and the high-k dielectric layer HK may form the gate insulating layer GI.

In some example embodiments, the high-k dielectric layer HK may be formed conformally. In other words, a thickness of the high-k dielectric layer HK in a horizontal direction may be equal to a thickness in a vertical direction.

In some example embodiments, the process of forming the high-k dielectric layer HK may be controlled such that a formation rate of the high-k dielectric layer HK is higher in the horizontal direction than in the vertical direction. In this case, the high-k dielectric layer HK may be formed such that a thickness in the horizontal direction is greater than that in the vertical direction.

According to some example embodiments of the inventive concepts, a thickness TK1 of the gate insulating layer GI on the first facet FA1 may be greater than a thickness TK2 of the gate insulating layer GI on the second facet FA2. In other words, the thickness TK1 of the gate insulating layer GI in the horizontal direction may be greater than the thickness TK2 in the vertical direction. Accordingly, it may be possible to reduce a leakage current of a transistor and to improve the electrical characteristics of the semiconductor device.

Meanwhile, since, as illustrated in FIG. 15B, the thickness TK2 of the gate insulating layer GI in the vertical direction has a relatively small value, the space SPA in each of the first to third inner regions IRG1, IRG2, and IRG3 may be formed to have a thickness greater than a value required for the formation of the gate electrode GE. This may make it possible to reduce a difficulty in filling the space SPA with the first to third portions PO1, PO2, and PO3 of the gate electrode GE of FIG. 12C.

Figure 12A:
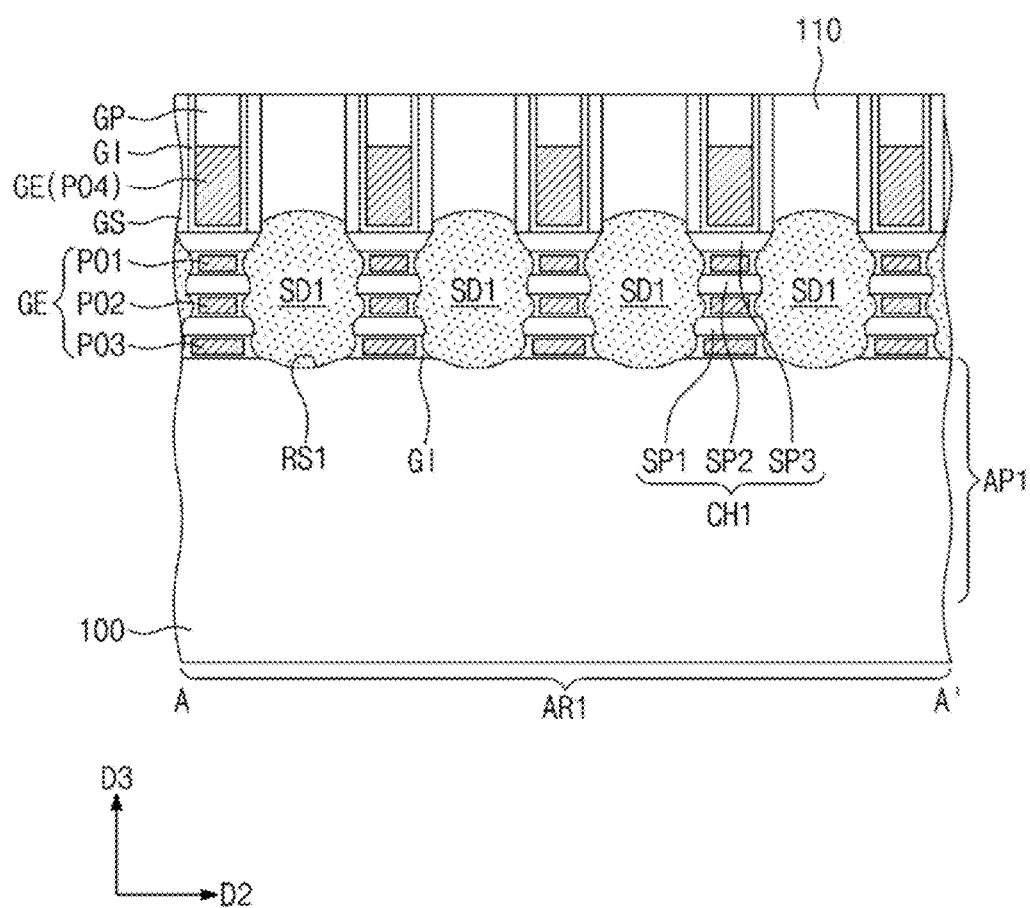
Figure 12B:
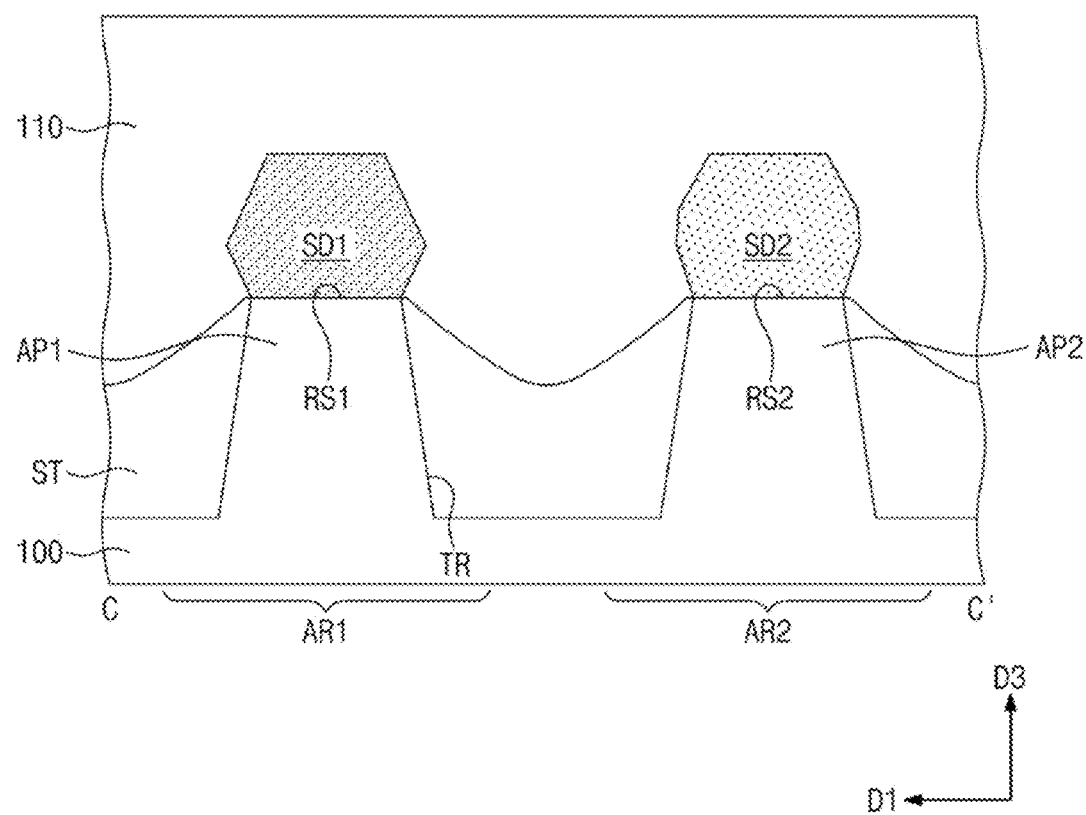
Figure 12C:
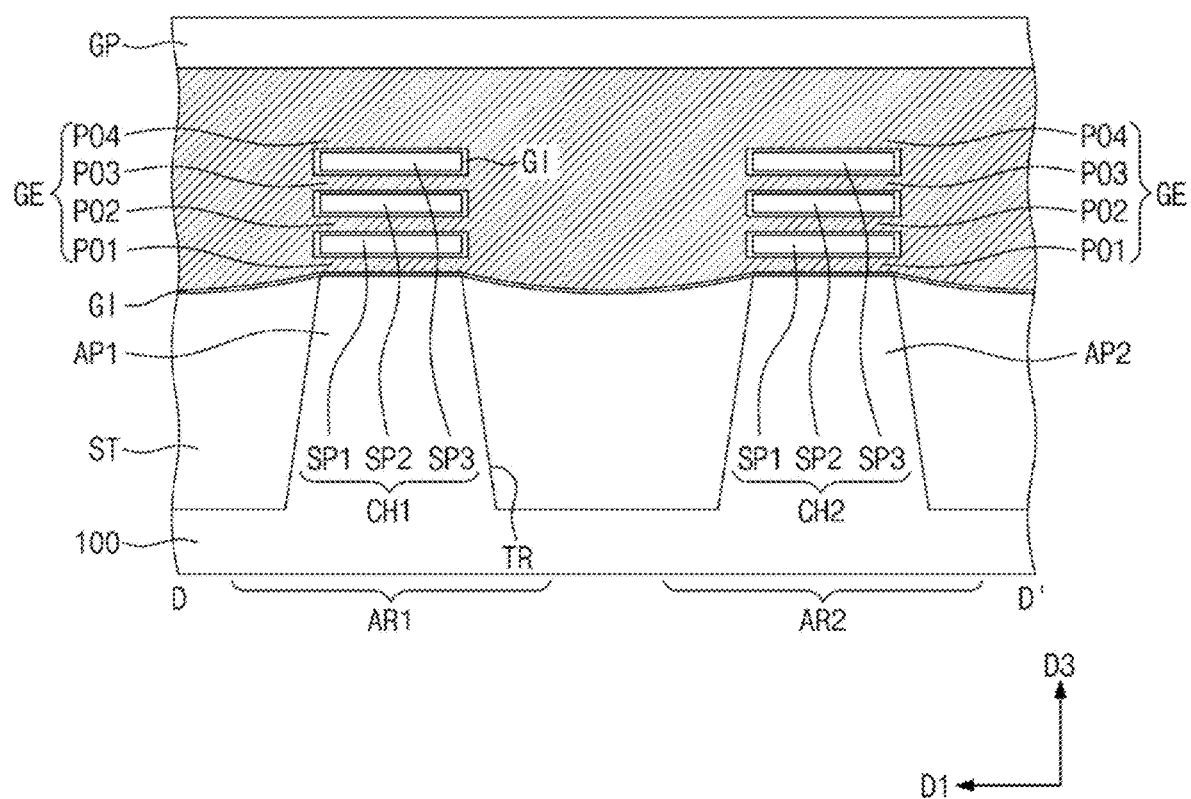

Referring to FIGS. 12A to 12C, the gate electrode GE may be formed on the gate insulating layer GI. The gate electrode GE may include the first to third portions PO1, PO2, and PO3, which are respectively formed in the first to third inner regions IRG1, IRG2, and IRG3, and the fourth portion PO4, which is formed in the outer region ORG. The gate electrode GE may be vertically recessed to have a reduced height. The gate capping pattern GP may be formed on the recessed gate electrode GE.

Referring back to FIGS. 5A to 5D, the second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

The formation of each of the active and gate contacts AC and GC may include forming the barrier pattern BM and forming the conductive pattern FM on the barrier pattern BM. The barrier pattern BM may be conformally formed and may include a metal layer and a metal nitride layer. The conductive pattern FM may be formed of or include a low resistance metal.

The division structures DB may be respectively formed on the first and second borders BD1 and BD2 of the single height cell SHC. The division structure DB may penetrate the second interlayer insulating layer 120 and the gate electrode GE and may be extended into the active pattern AP1 or AP2. The division structure DB may be formed of or include an insulating material (e.g., silicon oxide or silicon nitride).

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

Some embodiments of the inventive concepts will be further described below. In the following description of these embodiments, an element previously described with reference to FIGS. 6A and 6B may be identified by the same reference number without repeating an overlapping description thereof, for concise description.

Figure 16A:
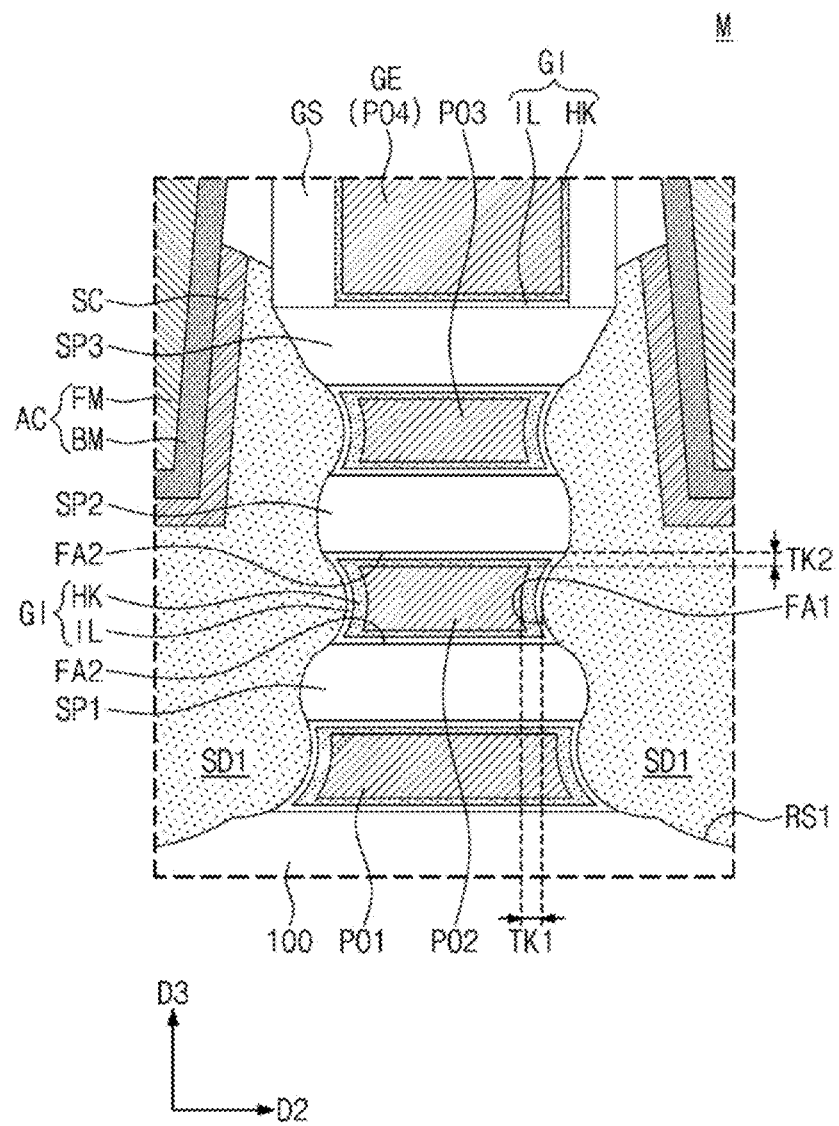
FIGS. 16A, 17A, and 18 are enlarged sectional views, each of which illustrates the portion 'M' of FIG. 5A according to some example embodiments of the inventive concepts.
Figure 16B:
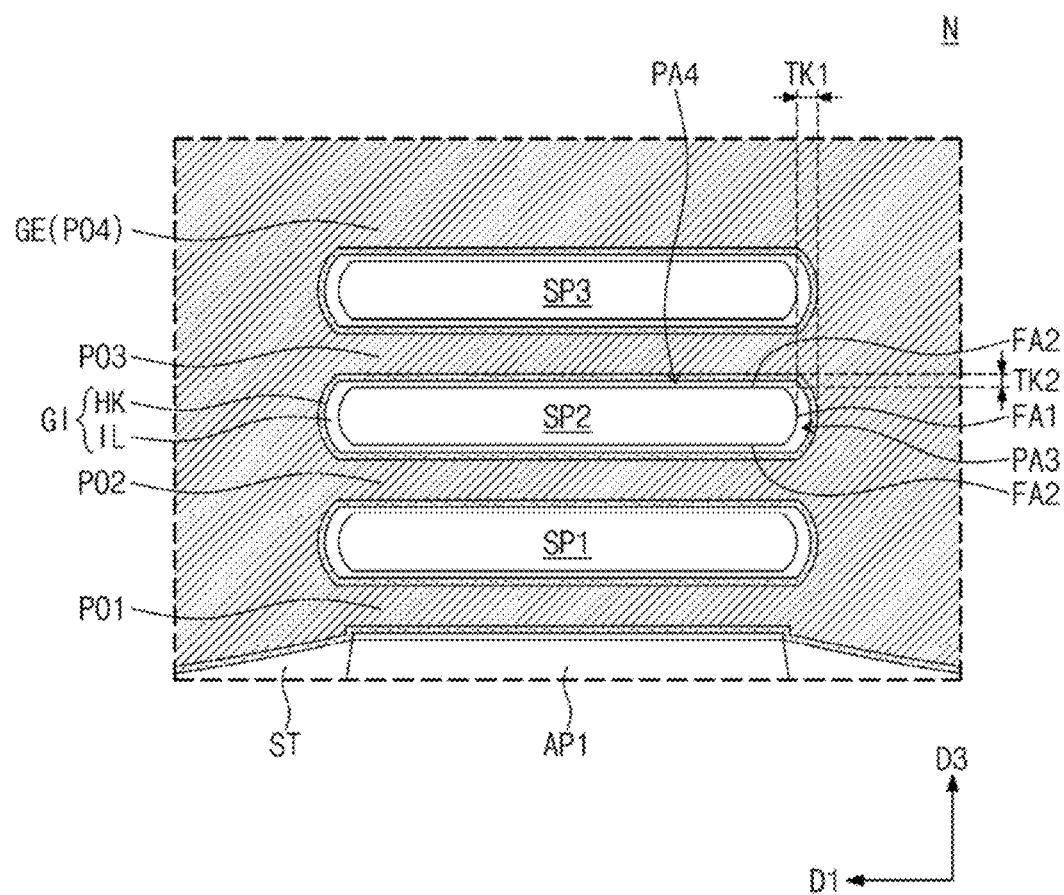
FIGS. 16B and 17B are enlarged sectional views, each of which illustrates the portion 'N' of FIG. 5D according to some example embodiments of the inventive concepts.
Figure 17A:
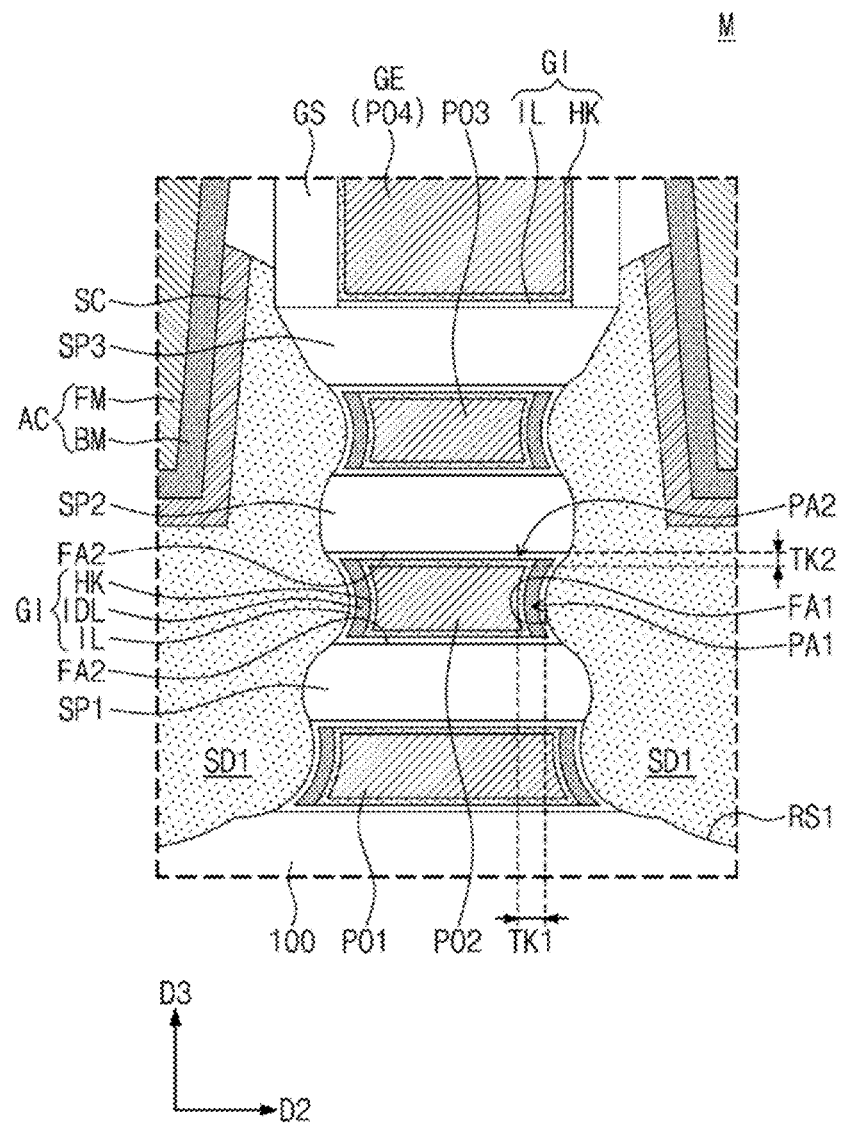
Figure 17B:
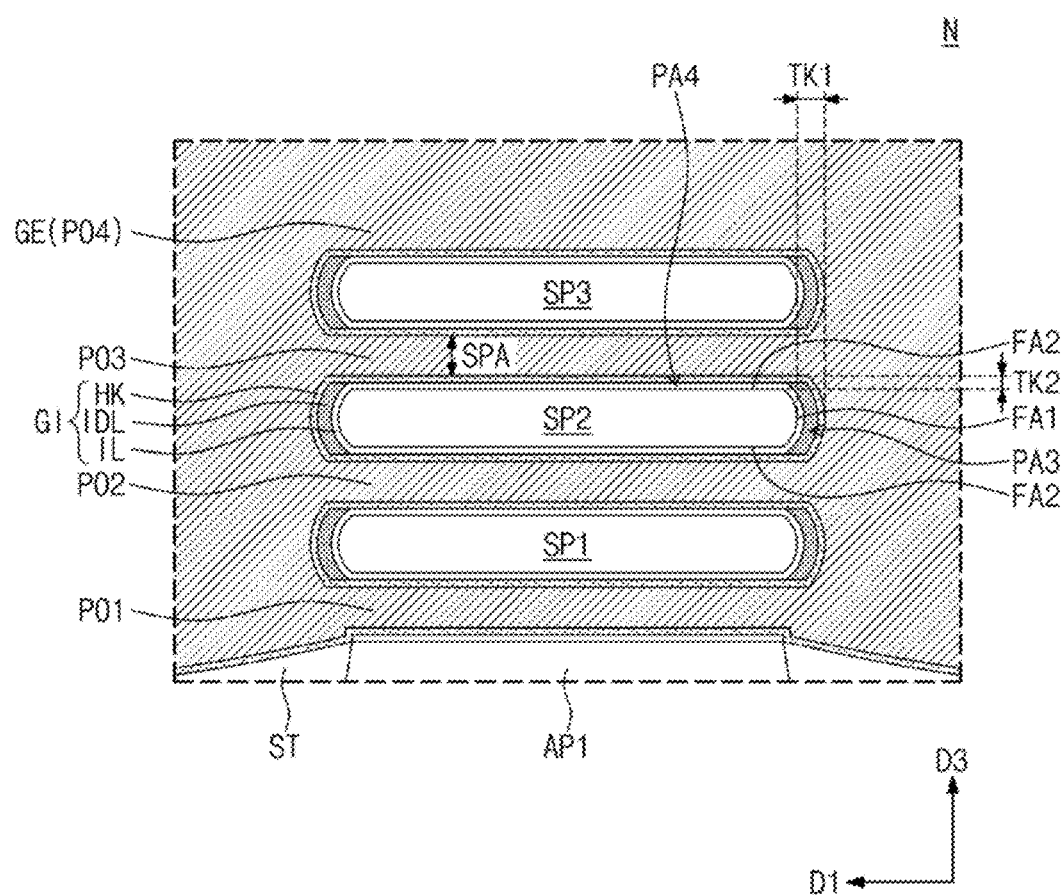
Figure 18:
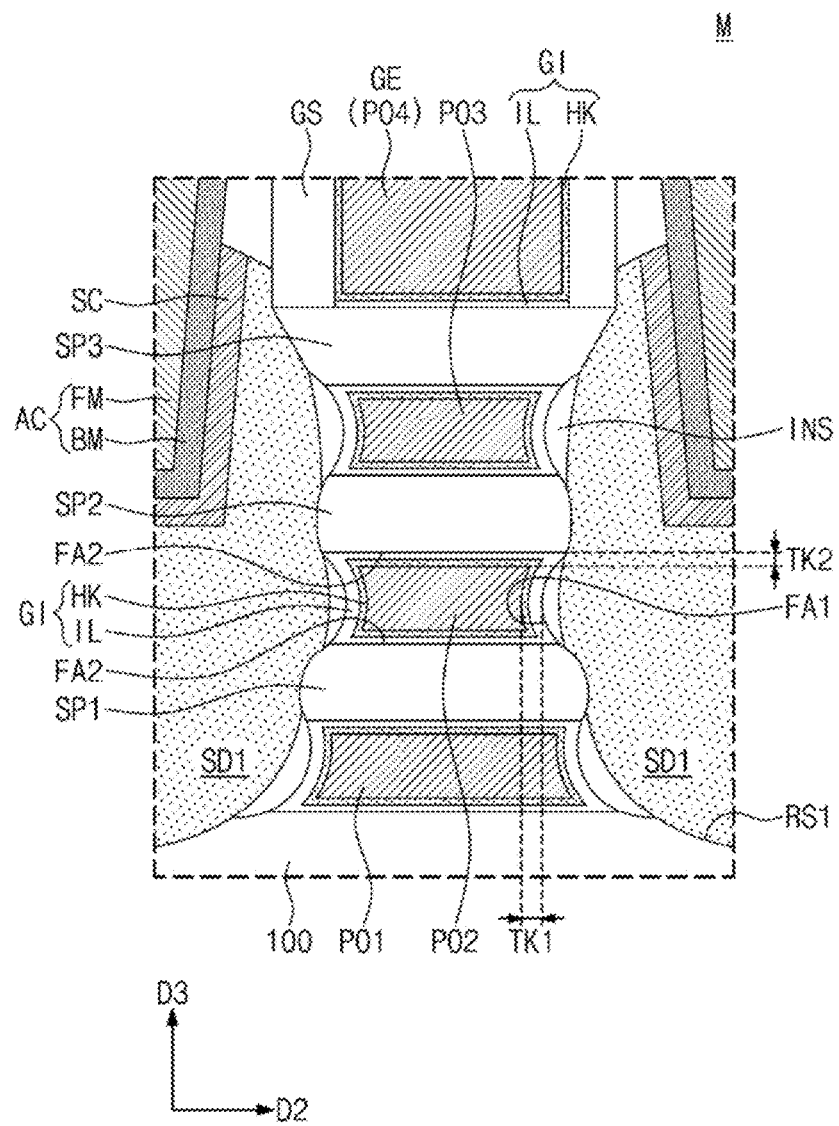

FIGS. 16A, 17A, and 18 are enlarged sectional views, each of which illustrates the portion 'M' of FIG. 5A according to some example embodiments of the inventive concepts. FIGS. 16B and 17B are enlarged sectional views, each of which illustrates the portion 'N' of FIG. 5D according to some example embodiments of the inventive concepts.

Referring to FIGS. 16A and 16B, a thickness of the high-k dielectric layer HK may be greater in a horizontal direction than in a vertical direction. For example, a thickness of the high-k dielectric layer HK on the first facet FA1 may be greater than a thickness of the high-k dielectric layer HK on the second facet FA2. Due to this difference in the thickness of the high-k dielectric layer HK, the first thickness TK1 of the gate insulating layer GI may have a value that is greater than the second thickness TK2.

In some example embodiments, the interface layer IL may have a uniform thickness. In some example embodiments, the thickness of the interface layer IL may also be greater in the horizontal direction than in the vertical direction, as illustrated in FIGS. 6A and 6B.

Referring to FIGS. 17A and 17B, the gate insulating layer GI may further include an intermediate layer IDL interposed between the interface layer IL and the high-k dielectric layer HK. The intermediate layer IDL may be selectively formed on the first facet FA1 but not on the second facet FA2, for example such that the second facet FA2 is exposed by the intermediate layer IDL, for example such that the interface layer IL and the high-k dielectric layer HK are in direct contact with each other in the third direction D3 in the region of the gate insulating layer GI in which the intermediate layer is omitted. For example, the gate insulating layer GI on the second facet FA2 may include the interface layer IL and the high-k dielectric layer HK, but not the intermediate layer IDL. Thus, the first thickness TK1 of the gate insulating layer GI may have a value that is greater than the second thickness TK2.

The intermediate layer IDL may be formed of or include a low-k dielectric material whose dielectric constant is lower than the high-k dielectric layer HK. For example, the intermediate layer IDL may include a silicon nitride layer or a silicon oxynitride layer.

Referring to FIG. 18, inner spacers INS may be respectively interposed between the first to third portions PO1, PO2, and PO3 of the gate electrode GE and the first source/drain pattern SD1. The inner spacers INS may be in direct contact with the first source/drain pattern SD1. Each of the first to third portions PO1, PO2, and PO3 of the gate electrode GE may be spaced apart from the first source/drain pattern SD1 by the inner spacer INS. The inner spacer INS may include a silicon oxide layer, a silicon nitride layer, or a silicon oxynitride layer.

In a three-dimensional field effect transistor according to some example embodiments of the inventive concepts, a thickness of a gate insulating layer may be greater in a horizontal direction than in a vertical direction. Accordingly, it may be possible to reduce a leakage current of a transistor in both of on- and off-states. In addition, a capacitance between a gate electrode and a source/drain pattern may be reduced. As a result, it may be possible to improved electrical characteristics of a semiconductor device according to some example embodiments of the inventive concepts.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
 a substrate including an active pattern;
 a channel pattern on the active pattern, the channel pattern including a plurality of semiconductor patterns vertically stacked to be spaced apart from each other;
 a source/drain pattern connected to the plurality of semiconductor patterns;
 a gate electrode on the plurality of semiconductor patterns, the gate electrode extending in a first direction that is parallel to a top surface of the substrate; and
 a gate insulating layer between the plurality of semiconductor patterns and the gate electrode,
 wherein a first semiconductor pattern of the plurality of semiconductor patterns includes opposite side surfaces, which are opposite to each other in the first direction, a bottom surface, and a top surface,
 wherein the gate insulating layer covers the opposite side surfaces of the first semiconductor pattern, the bottom surface of the first semiconductor pattern, and the top surface of the first semiconductor pattern,
 wherein the gate insulating layer includes
 a first region on one of the opposite side surfaces of the first semiconductor pattern; and
 a second region on one of the top surface of the first semiconductor pattern or the bottom surface of the first semiconductor pattern, and
 wherein a thickness of the first region in the first direction is greater than a thickness of the second region in a second direction that is perpendicular to the top surface of the substrate.

2. The semiconductor device of claim 1, wherein the gate insulating layer comprises:
 an interface layer which directly covers the first semiconductor pattern, and
 a high-k dielectric layer which is on the interface layer.

3. The semiconductor device of claim 2, wherein a thickness in the first direction of the interface layer of the first region is greater than a thickness in the second direction of the interface layer of the second region.

4. The semiconductor device of claim 2, wherein a thickness in the first direction of the high-k dielectric layer of the first region is greater than a thickness in the second direction of the high-k dielectric layer of the second region.

5. The semiconductor device of claim 2, wherein
 the gate insulating layer further comprises an intermediate layer between the interface layer and the high-k dielectric layer, and
 the intermediate layer is selectively on the first region such that the second region is exposed by the intermediate layer.

6. The semiconductor device of claim 1, wherein
 the one of the opposite side surfaces of the first semiconductor pattern comprises a first crystallographic plane that is normal to the first direction, and
 the one of the top surface of the first semiconductor pattern or the bottom surface of the first semiconductor pattern comprises a second crystallographic plane that is normal to the second direction.

7. The semiconductor device of claim 6, wherein
 the first crystallographic plane is a {1 1 0} crystallographic plane, and
 the second crystallographic plane is a {1 0 0} crystallographic plane.

8. The semiconductor device of claim 1, wherein
 the gate electrode comprises a portion that is between the first semiconductor pattern and a second semiconductor pattern of the plurality of semiconductor patterns, the second semiconductor pattern adjacent to the first semiconductor pattern,
 the gate insulating layer comprises a third region between the portion of the gate electrode and the source/drain pattern and a fourth region between the portion of the gate electrode and the second semiconductor pattern, and
 a thickness of the third region perpendicular to the second direction is greater than a thickness of the fourth region in the second direction.

9. The semiconductor device of claim 8, wherein the third region of the gate insulating layer directly covers a side surface of the source/drain pattern.

10. The semiconductor device of claim 8, wherein
 the source/drain pattern comprises a protruding portion protruding toward the portion of the gate electrode, and
 a side surface of the source/drain pattern has a wavy profile such that a position of the side surface oscillates perpendicularly to the second direction as the side surface of the source/drain pattern extends in the second direction.

11. A semiconductor device, comprising:
 a substrate including an active pattern;

a channel pattern on the active pattern, the channel pattern including a plurality of semiconductor patterns vertically stacked to be spaced apart from each other;

a source/drain pattern connected to the plurality of semiconductor patterns;

a gate electrode on the plurality of semiconductor patterns; and a gate insulating layer between the plurality of semiconductor patterns and the gate electrode, wherein the gate electrode comprises a portion between a first semiconductor pattern and a second semiconductor pattern which are two adjacent semiconductor patterns of the plurality of semiconductor patterns, wherein the gate insulating layer includes
   a first region between the portion of the gate electrode and a side surface of the source/drain pattern; and
   a second region between the portion of the gate electrode and a bottom surface of the second semiconductor pattern, wherein the first region of the gate insulating layer directly covers the side surface of the source/drain pattern, wherein a thickness of the first region in a first direction that is parallel to a top surface of the substrate is greater than a thickness of the second region in a second direction that is perpendicular to the top surface of the substrate, and wherein a central portion of the first region of the gate insulating layer is recessed towards the gate electrode in the first direction.

12. The semiconductor device of claim 11, wherein
the side surface of the source/drain pattern comprises a {1 1 0} crystallographic plane, and
the bottom surface of the second semiconductor pattern comprises a {1 0 0} crystallographic plane.

13. The semiconductor device of claim 11, wherein the gate insulating layer comprises
   an interface layer, which covers the side surface of the source/drain pattern and the bottom surface of the second semiconductor pattern, and
   a high-k dielectric layer on the interface layer.

14. The semiconductor device of claim 13, wherein a thickness of the interface layer of the first region in the first direction is greater than a thickness of the interface layer of the second region in the second direction.

15. The semiconductor device of claim 13, wherein
the gate insulating layer further comprises an intermediate layer between the interface layer and the high-k dielectric layer, and
the intermediate layer is selectively on the first region such that the second region is exposed by the intermediate layer.

16. A semiconductor device, comprising:
a substrate including an active region;
a device isolation layer defining an active pattern on the active region;
a channel pattern and a source/drain pattern on the active pattern;

a gate electrode on the channel pattern, the gate electrode extending in a first direction that is parallel to a top surface of the substrate;
a gate insulating layer between the gate electrode and the channel pattern;
a gate spacer on a side surface of the gate electrode;
a gate capping pattern on a top surface of the gate electrode;
an interlayer insulating layer on the gate capping pattern;
an active contact that penetrates the interlayer insulating layer and is electrically connected to the source/drain pattern;
a metal-semiconductor compound layer between the active contact and the source/drain pattern;
a gate contact that penetrates the interlayer insulating layer and the gate capping pattern and is electrically connected to the gate electrode;
a first metal layer on the interlayer insulating layer, the first metal layer including first interconnection lines, which are electrically connected to the active contact and the gate contact, respectively, and a power line; and
a second metal layer on the first metal layer,
wherein the second metal layer includes second interconnection lines electrically connected to the first metal layer,
the channel pattern comprises a plurality of semiconductor patterns, which are stacked in a second direction perpendicular to the top surface of the substrate,
the gate insulating layer encloses a first semiconductor pattern of the plurality of semiconductor patterns,
the gate insulating layer enclosing the first semiconductor pattern has a first thickness in the first direction and a second thickness in the second direction, and
the first thickness is greater than the second thickness.

17. The semiconductor device of claim 16, wherein the gate insulating layer comprises
   an interface layer, which directly covers the first semiconductor pattern, and
   a high-k dielectric layer, which is provided on the interface layer.

18. The semiconductor device of claim 17, wherein a thickness of the interface layer is greater in the first direction than in the second direction.

19. The semiconductor device of claim 17, wherein a thickness of the high-k dielectric layer is greater in the first direction than in the second direction.

20. The semiconductor device of claim 17, wherein
the gate insulating layer further comprises an intermediate layer between the interface layer and the high-k dielectric layer,
the interface layer, the intermediate layer, and the high-k dielectric layer are stacked in the first direction, and
the intermediate layer is omitted from a region between the interface layer and the high-k dielectric layer stacked in the second direction, such that the interface layer and the high-k dielectric layer are in direct contact with each other in the second direction in the region.

* * * * *